United States Patent
Taniguchi et al.

(10) Patent No.: US 7,283,416 B2
(45) Date of Patent: Oct. 16, 2007

(54) SEMICONDUCTOR DEVICE INCLUDING VOLTAGE LEVEL CONVERSION OUTPUT CIRCUIT

(75) Inventors: Kazuya Taniguchi, Kasugai (JP); Toshiyuki Nishii, Kasugai (JP); Hiromichi Mizuno, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/652,589

(22) Filed: Jan. 12, 2007

(65) Prior Publication Data

US 2007/0109901 A1  May 17, 2007

Related U.S. Application Data

(62) Division of application No. 10/997,891, filed on Nov. 29, 2004, now Pat. No. 7,180,812.

(30) Foreign Application Priority Data

Aug. 18, 2004 (JP) ............................. 2004-238326

(51) Int. Cl.
*G11C 5/14* (2006.01)

(52) U.S. Cl. .................................. 365/226; 365/189.05
(58) Field of Classification Search ................ 365/226, 365/189.05, 189.09
See application file for complete search history.

(56) References Cited

U.S. PATENT DOCUMENTS

| | | | |
|---|---|---|---|
| 5,559,464 A * | 9/1996 | Orii et al. .................... 327/333 |
| 6,072,354 A | 6/2000 | Tachibana et al. | |
| 6,278,294 B1 * | 8/2001 | Taniguchi ..................... 326/80 |
| 6,829,177 B2 * | 12/2004 | Bedarida et al. ........ 365/189.05 |
| 6,980,035 B1 | 12/2005 | Zhou et al. | |
| 2002/0024873 A1 * | 2/2002 | Tomishima et al. ..... 365/230.06 |

* cited by examiner

*Primary Examiner*—Anh Phung
(74) *Attorney, Agent, or Firm*—Arent Fox LLP

(57) ABSTRACT

A semiconductor device for easily changing an operating voltage of an I/O circuit. The I/O circuit includes a first I/O cell, which operates with a first high-potential power supply, and a second I/O cell, which operates with a second high-potential power supply. The I/O circuit includes a control circuit for selectively activating the first and second I/O cells according to a voltage selection signal. In the I/O circuit, a signal having a voltage according to an operating voltage of the selected I/O cell is generated.

6 Claims, 16 Drawing Sheets

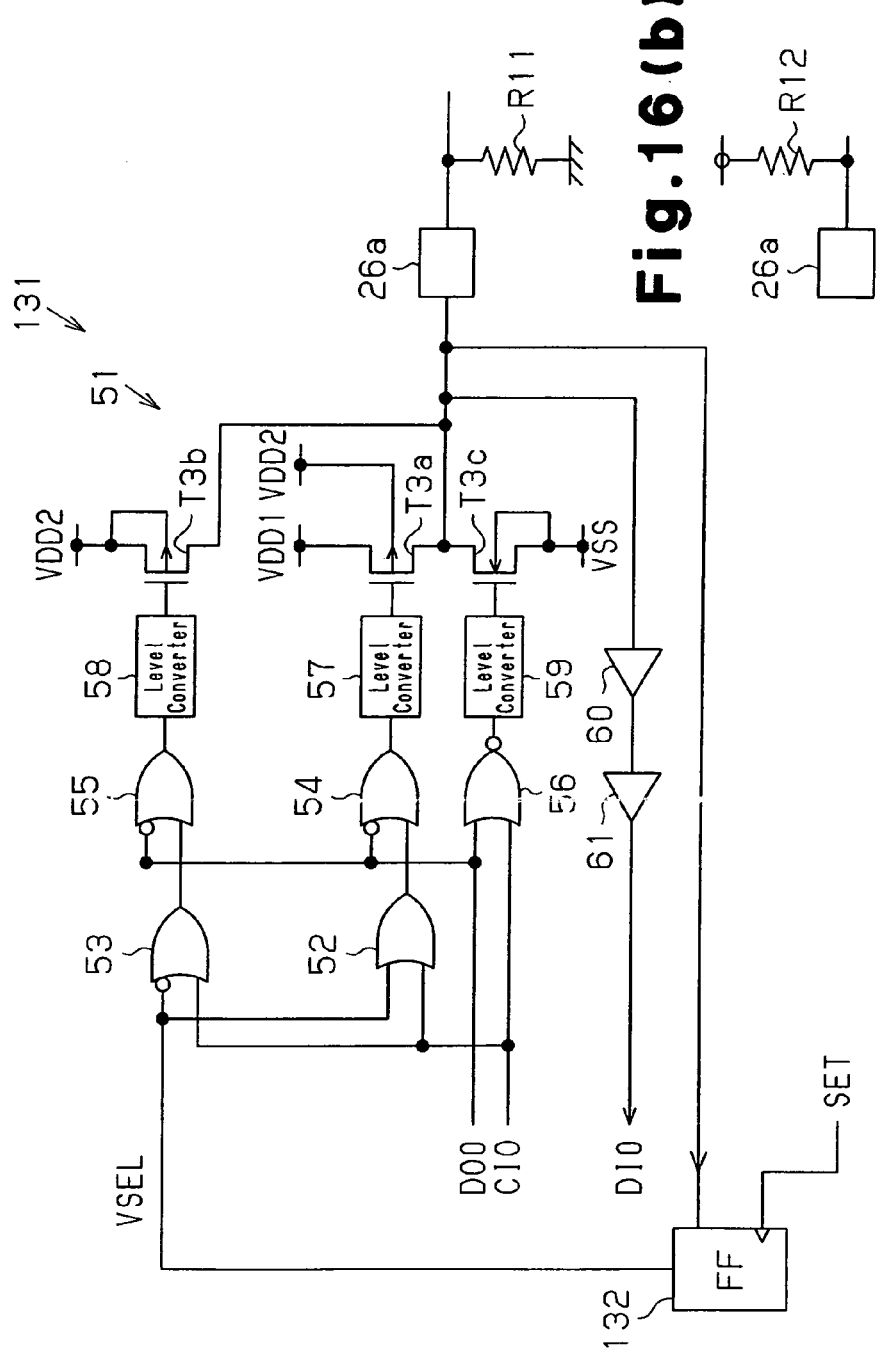
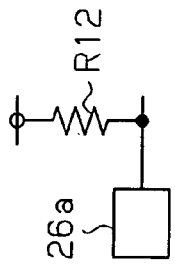
Fig.16(a)
Fig.16(b)

| A | B | Result |
|---|---|---|
| 0 | 0 | Wait Determination |
| 1 | 0 | Use VDD1 as I/O |
| 1 | 1 | Use VDD2 as I/O |

SEMICONDUCTOR DEVICE INCLUDING VOLTAGE LEVEL CONVERSION OUTPUT CIRCUIT

CROSS-REFERENCE TO RELATED APPLICATIONS

This is a Divisional Application, which claims the benefit of U.S. patent application Ser. No. 10/997,891, filed Nov. 29, 2004, now U.S. Pat. No. 7,180,812, issued on Feb. 20, 2007. The disclosure of the prior application is hereby incorporated herein in its entirety by reference.

BACKGROUND OF THE INVENTION

The present invention relates to a semiconductor device, and more particularly, to a semiconductor device including an output circuit that converts an output signal level of an internal circuit to a level according to an externally connected device.

In recent years, semiconductor devices are increasingly highly integrated, and operate at higher speed. To reduce power consumption, efforts have also been made to lower the driving voltage of semiconductor devices. However, some semiconductor devices, whose driving voltage is yet to be lowered, still operate at high driving voltages. A semiconductor device may be connected to a plurality of other semiconductor devices that have different power supply voltages. Such a semiconductor device includes input and output (I/O) circuits for generating operating voltages corresponding to the power supply voltages of the other semiconductor devices.

The I/O circuits are conventionally arranged on the periphery of the semiconductor device. The other semiconductor devices and such elements as resistors are connected to the I/O circuits. To distinguish between semiconductor devices, the semiconductor device on which attention is focused is herein referred to as a "main semiconductor device", and a semiconductor device connected to the main semiconductor device is herein referred to as a "sub-semiconductor device".

The operating voltage of an I/O circuit of a sub-semiconductor device differs depending on its type (e.g., its memory). The main semiconductor device includes a plurality of I/O circuit blocks corresponding to operating voltages of one or more sub-semiconductor devices. Each I/O circuit block provides the corresponding operating voltage via a terminal (pad).

For example, as shown in FIG. 1, I/O blocks 12a, 12b, 12c, and 12d are arranged on the periphery of a main semiconductor device 11, and an internal circuit 13 is arranged inside the blocks 12a, 12b, 12c, and 12d. Each of the blocks 12a, 12b, 12c, and 12d includes a plurality of I/O circuits. Each block may include input circuits or output circuits instead of I/O circuits.

The blocks 12a to 12d are connected to a corresponding sub-semiconductor device. Each of the blocks 12a to 12d receives a power supply voltage according to the power supply voltage of the corresponding sub-semiconductor device, and generates a signal having a level corresponding to the received power supply voltage.

For example, each of the first and third blocks 12a and 12c is connected to a sub-semiconductor device that includes an I/O circuit, which operates at a first power supply voltage VDD1 (e.g., 1.8 V). Each of the blocks 12a and 12c is supplied with the first power supply voltage VDD1. Also, each of the second and fourth blocks 12b and 12d is connected to a sub-semiconductor device that includes an I/O circuit, which operates at a second power supply voltage VDD2 (e.g., 3.3 V). Each of the blocks 12b and 12d is supplied with the second power supply voltage VDD2.

The internal circuit 13 operates at a predetermined internal power supply voltage VDDI (e.g., 1.2 V), and inputs and outputs a signal having a level corresponding to the internal power supply voltage VDDI. Thus, each I/O circuit included in the first and third blocks 12a and 12c includes a level conversion circuit for converting voltages between the first power supply voltage VDD1 and the internal power supply voltage VDDI. Each I/O circuit included in the second and fourth blocks 12b and 12d includes a level conversion circuit for converting voltages between the second power supply voltage VDD2 and the internal power supply voltage VDDI.

Each of the first and third blocks 12a and 12c converts the voltage of a signal from the internal circuit 13 of the main semiconductor device into the first power supply voltage VDD1, and provides the corresponding sub-semiconductor device with a signal having the first power supply voltage VDD1. Each of the second and fourth blocks 12b and 12d converts the voltage of a signal from the internal circuit 13 into the second power supply voltage VDD2, and provides the corresponding sub-semiconductor device with a signal having the second power supply voltage VDD2.

Pads of each of the blocks 12a to 12d are connected to power supply wiring to which the first power supply voltage VDD1 or the second power supply voltage VDD2 is provided. With this structure, the operating voltage of each of the blocks 12a to 12d is changed in correspondence with the operating voltage of the connected sub-semiconductor device, by changing the power supply voltage provided to the power supply wiring of each of the blocks 12a to 12d.

SUMMARY OF THE INVENTION

The operating voltage of only some of the I/O circuits included in one block (i.e., some of the I/O circuits included in the block 12a) may require changing in correspondence with the connected sub-semiconductor device. However, a plurality of I/O circuits included in each of the blocks 12a to 12d are commonly connected to the same power supply wiring. It is impossible to change the operating voltage of only some I/O circuits included in one block. To enable the operating voltage of only some I/O circuits to be changed, a mask used in manufacturing processes for the main semiconductor device needs to be newly created. Creating a new mask requires a great number of days, and increases the manufacturing cost of the main semiconductor device.

Further, in the main semiconductor device 11 including the I/O blocks 12a to 12d, pads relating to each of power supply wiring groups need to be arranged close to one another. This decreases flexibility in arranging pads.

To increase flexibility in arranging pads, the number of power supply wiring groups may be increased. However, each power supply wiring group must be supplied with the required power supply. This means that an increase in the number of power supply wiring groups increases the number of required power supplies (the number of power supply wirings and the number of pads for providing power supplies). Further, each power supply wiring group needs to be isolated from one another by a well. Thus, the area of wells decreases, and the electrostatic discharge (ESD) withstand voltage of the main semiconductor device 11 decreases.

The present invention provides a semiconductor device that easily changes the operating voltage of an I/O circuit.

One aspect of the present invention is a semiconductor device including an internal circuit for generating an output signal, and an output circuit, connected to the internal circuit, for converting a voltage level of the output signal of the internal circuit. The output circuit includes a plurality of output cells for generating a plurality of level-converted output signals having different voltages, respectively. A control circuit, connected to the plurality of output cells, selects one of the plurality of output cells according to a voltage selection signal.

Another aspect of the present invention is a semiconductor device including an internal circuit for generating an output signal, and an output circuit, connected to the internal circuit, for converting a voltage level of the output signal of the internal circuit. The output circuit includes a plurality of first output transistors connected to a plurality of high-potential power supplies and having different voltage, respectively. A second output transistor is connected to a low-potential power supply and to the plurality of first output transistors. A control circuit selects one of the plurality of first output transistors according to a voltage selection signal and causes the selected first output transistor and the second output transistor to perform a level conversion operation.

A further aspect of the present invention is a semiconductor device including an internal circuit for generating an output signal. An output circuit, connected to the internal circuit, converts a voltage level of the output signal of the internal circuit. The output circuit includes a plurality of first output transistors connected to a plurality of high-potential power supplies having different voltages, respectively. A second output transistor is connected to a low-potential power supply and to the plurality of first output transistors. A control circuit selects, in a first mode, one of the plurality of first output transistors according to a voltage selection signal and causes the selected first output transistor and the second output transistor to perform a level conversion operation, and sequentially controls, in a second mode, the plurality of first output transistors according to the voltage of each of the plurality of high-potential power supplies.

Another aspect of the present invention is a semiconductor device including an internal circuit for generating an output signal. An output circuit, connected to the internal circuit, converts a voltage level of the output signal of the internal circuit. The output circuit includes a plurality of output cells generating a plurality of level-converted output signals having different voltages. A plurality of pads are respectively connected to the plurality of output cells.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 16(a) is a circuit diagram of an I/O circuit according to a fifth modification, and FIG. 16(b) is a circuit diagram showing a modified example of a part of the I/O circuit of FIG. 16(a);

DETAILED DESCRIPTION OF THE PREFERRED EMBODIMENTS

Figure 1:
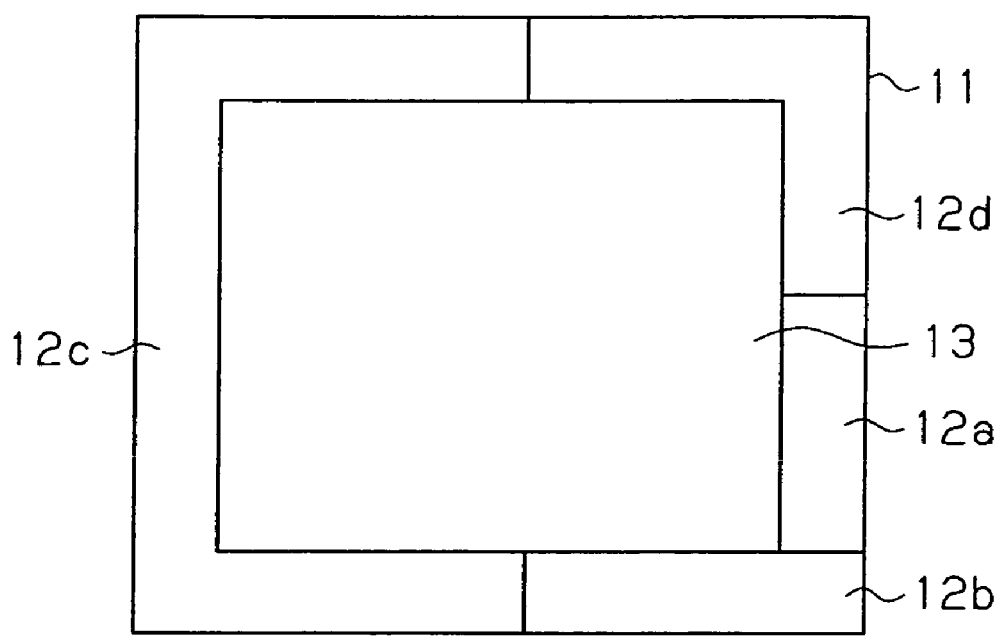
FIG. 1 is a schematic diagram of a conventional semiconductor device.

In the drawings, like numerals are used for like elements throughout.

The following describes a semiconductor device 21 according to a first embodiment of the present invention, with reference to FIGS. 2 to 5.

A plurality of (eight in FIG. 2) input and output (I/O) blocks 22a to 22h are formed on the periphery of the semiconductor device 21. An internal circuit 23 having various functions is formed in the center of the semiconductor device 21.

Each of the I/O blocks 22a to 22h includes a plurality of input and output (I/O) circuits 25 (or output circuits and/or input circuits) described later. The internal circuit 23 transmits and receives, via the I/O circuits 25, signals to and from other semiconductor devices connected to the semiconductor device 21. The internal circuit 23 operates at an internal operating power supply VDDI, and inputs and outputs signals to and from such elements as resistors connected to the semiconductor device 21.

Power supply wirings 24a, 24b, and 24c, which are formed as rings, are arranged on the I/O blocks 22a to 22h. The first power supply wiring 24a is provided with a first high-potential power supply VDD1. The second power supply wiring 24b is provided with a second high-potential power supply VDD2. The third power supply wiring 24c is provided with a low-potential power supply VSS. The first and second high-potential power supplies VDD1 and VDD2 are set at voltages according to the operating power supply voltages of the other semiconductor devices connected to the semiconductor device 21 (specifically, the operating voltages of their input circuits) and to voltages provided to the elements. For example, the first high-potential power supply VDD1 is set at 1.8 V, the second high-potential power supply VDD2 at 3.3 V, and the low-potential power supply voltage at 0 V. The internal operating power supply VDDI provided to the internal circuit 23 is set according to the operation of the internal circuit 23, and is set at a value substantially the same as the first high-potential power supply VDD1 in the present embodiment.

At least one of the I/O blocks 22a to 22h, namely, the I/O block 22a in the present embodiment, is provided with the first and second high-potential power supplies VDD1 and VDD2. Each of the other I/O blocks 22b to 22h is provided with the first high-potential power supply VDD1 or the second high-potential power supply VDD2 in correspondence with the semiconductor device connected thereto. For example, each of the I/O blocks 22b, 22c, and 22h receives the first high-potential power supply VDD1, and inputs or outputs a signal having the level of the first high-potential power supply VDD1. Each of the I/O blocks 22d, 22e, 22f, 22g, and 22h receives the second high-potential power supply VDD2, and inputs or outputs a signal having the level of the second high-potential power supply VDD2.

Figure 3:
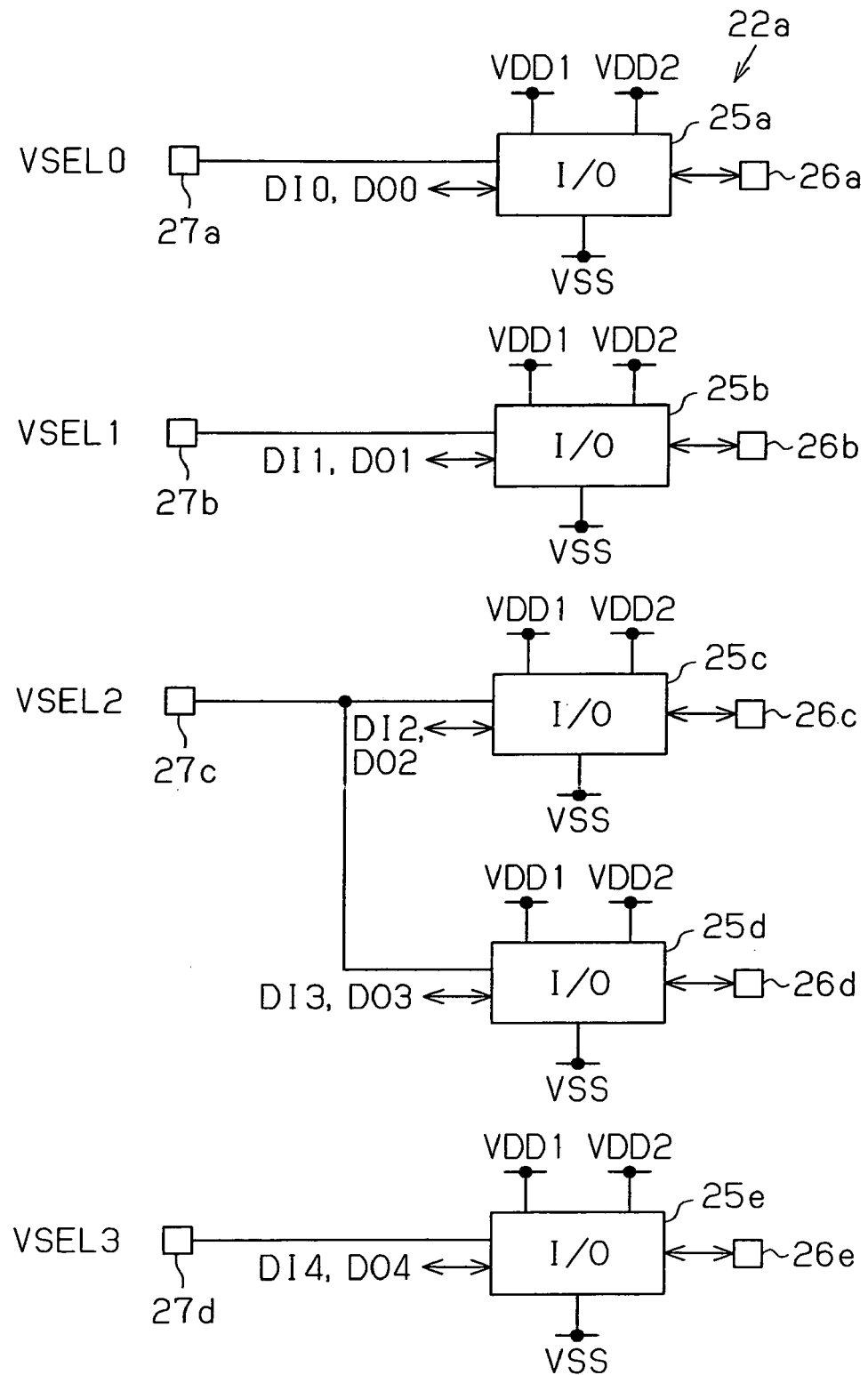
FIG. 3 is a schematic block diagram of an I/O block included in the semiconductor device of FIG. 2.

As shown in FIG. 3, the I/O block 22a includes a plurality of (five in the present embodiment) I/O circuits 25a to 25e. Each of the I/O circuits 25a to 25e is provided with the first and second high-potential power supplies VDD1 and VDD2 and the low-potential power supply VSS.

The I/O circuits 25a to 25e respectively receive, from the internal circuit 23, signals DO0 to DO4 having a level according to the operating voltage of the internal circuit 23 (the first high-potential power supply VDD1). The I/O circuits 25a to 25e respectively provide the internal circuit 23 with signals DI0 to DI4 having a level according to the operating voltage of the internal circuit 23.

The I/O circuits 25a to 25e are connected to pads 26a to 26e, respectively. The I/O circuit 25a is provided with a voltage selection signal VSEL0. The I/O circuit 25b is provided with a voltage selection signal VSEL1. The I/O circuits 25c and 25d are provided with a voltage selection signal VSEL2. The I/O circuit 25e is provided with a voltage selection signal VSEL3. In the present embodiment, an external device provides the voltage selection signals VSEL0 to VSEL3 to the semiconductor device 21 via pads 27a to 27d included in the semiconductor device 21.

The I/O circuits 25a to 25e each input and output signals having the level of the first high-potential power supply VDD1 or the level of the second high-potential power supply VDD2 according to the corresponding voltage selection signals VSEL0 to VSEL3, to the corresponding semiconductor devices via the corresponding pads 26a to 26e. For example, the I/O circuits 25a to 25e each input or output signals having the level of the first high-potential power supply VDD1 in response to the corresponding voltage selection signals VSEL0 to VSEL3 at a low (L) level, and input or output signals having the level of the second high-potential power supply VDD2 in response to the corresponding voltage selection signals VSEL0 to VSEL3 at a high (H) level.

Thus, appropriately setting the level of each of the voltage selection signals VSEL0 to VSEL3 enables all the I/O circuits 25a to 25e included in the I/O block 22a to operate using the first high-potential power supply VDD1 or the second high-potential power supply VDD2 as their operating voltage. Also, appropriately setting the level of each of the voltage selection signals VSEL0 to VSEL3 enables only some of the I/O circuits 25a to 25e included in the I/O block 22a to operate using the first high-potential power supply VDD1 or the second high-potential power supply VDD2 as their operating voltage. Further, the number of the I/O circuits whose operating voltage is changed is freely set.

Figure 4:
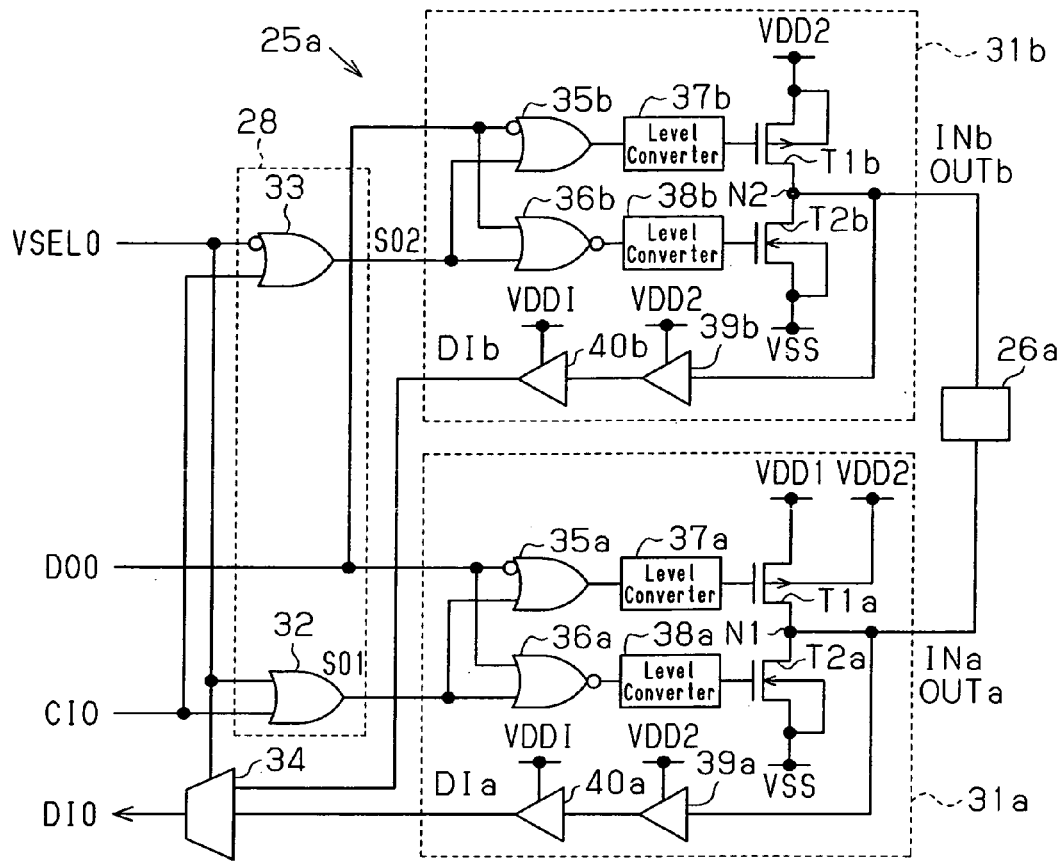
FIG. 4 is a circuit diagram of an I/O circuit included in the I/O block of FIG. 3 according to a first embodiment of the present invention.

FIG. 4 is a circuit diagram of the I/O circuit 25a.

The I/O circuit 25a includes first and second I/O cells 31a and 31b, which are connected to the pad 26a. The first I/O cell 31a inputs and outputs at the first high-potential power supply VDD1. The second I/O cell 31b inputs and outputs at the second high-potential power supply VDD2. The I/O circuit 25a is provided with a voltage selection signal VSEL0 and a control signal CIO. The control signal CIO is provided from the internal circuit 23, and controls whether to activate the first I/O cell 31a and the second I/O cell 31b as an output cell. According to the voltage selection signal VSEL0, one of the first and second I/O cells 31a and 31b is activated to input or output a signal.

In detail, the I/O circuit 25a includes two logic circuits 32 and 33, each of which receives a voltage selection signal VSEL0 and a control signal CIO. The first logic circuit 32 generates a signal S01 having substantially the same level as the level of a control signal CIO in response to an L level voltage selection signal VSEL0, and generates an H level signal S01 in response to an H level voltage selection signal VSEL0. The second logic circuit 33 generates a signal S02 having substantially the same level as the level of a control signal CIO in response to an H level voltage selection signal VSEL0, and generates an H level signal S02 in response to an L level voltage selection signal VSEL0.

The first I/O cell 31a operates as an output cell in response to an L level signal S01, and converts a signal DO0 into a signal OUTa having the level of the first high-potential power supply VDD1. The second I/O cell 31b operates as an output cell in response to an L level signal S02, and converts a signal DO0 into a signal OUTb having the level of the second high-potential power supply VDD2.

The first I/O cell 31a operates as an input cell in response to an H level signal S01, and converts a signal INa, which is provided from an external semiconductor device via the pad 26a, into a signal DIa having the level of the internal operating power supply VDDI. The second I/O cell 31b operates as an input cell in response to an H level signal S02, and converts a signal INb, which is provided from the external semiconductor device via the pad 26a, into a signal DIb having the level of the internal operating power supply VDDI.

The first and second logic circuits 32 and 33 form a control circuit 28, which selects one of the first I/O cell 31a and the second I/O cell 31b, and activate the selected I/O cell.

The I/O circuit 25a further includes a selector circuit 34 responsive to a voltage selection signal VSEL0. The selector circuit 34 is provided with a signal DIa from the first I/O cell 31a, and with a signal DIb from the second I/O cell 31b. The selector circuit 34 selects one of the signal DIa and the signal DIb in response to a voltage selection signal VSEL0, and outputs an input signal DI0 having substantially the same level as the level of the selected signal.

The following describes the first I/O cell 31a.

The first I/O cell 31a includes two logic circuits 35a and 36a, two level conversion circuits 37a and 38a, two input buffers 39a and 40a, and two output transistors T1a and T2a.

Each of the logic circuits 35a and 36a is provided with a signal S01 and an output signal DO0. The first logic circuit 35a generates an inversion signal of the output signal DO0 in response to an L level signal S01, and generates an H level signal in response to an H level signal S01. The second logic circuit 36a generates an inversion signal of the output signal DO0 in response to an L level signal S01, and generates an L level signal in response to an H level signal S01.

The first level conversion circuit 37a converts an input signal having the level of the internal operating power supply VDDI (an output signal of the first logic circuit 35a), into an input signal having the level of the second high-potential power supply VDD2. The second level conversion circuit 38a converts an input signal having the level of the internal operating power supply VDDI (an output signal of the second logic circuit 36a), into an input signal having the level of the second high-potential power supply VDD2.

The first output transistor T1a is a PMOS (P-channel metal oxide semiconductor) transistor. The second output transistor T2a is an NMOS (N-channel metal oxide semiconductor) transistor. The first output transistor T1a has its source connected to the first high-potential power supply VDD1, its drain connected to the second output transistor T2a, its gate provided with an output signal of the first level conversion circuit 37a, and its back gate connected to the second high-potential power supply VDD2. The second output transistor T2a has its source connected to the low-potential power supply VSS, its drain connected to the first output transistor T1a, its gate provided with an output signal of the second level conversion circuit 38a, and its back gate connected to the low-potential power supply VSS.

The back gate of the first output transistor T1a is set so that no current flows through the first output transistor T1a in a high impedance state. To be specific, with the outputs of the first and second I/O cells 31a and 31b being connected to the pad 26a, a signal output from the second I/O cell 31b is provided to the drains of the output transistors T1a and T2a included in the first I/O cell 31a. When the first output transistor T1a, which is a PMOS transistor, has its back gate connected to the first high-potential power supply VDD1, the potential of its back gate is lower than the potential of its drain. Thus, a forward diode is formed in a direction from the drain to the back gate of the first output transistor T1a and current flows through the first output transistor T1a. The back gate of the first output transistor T1a is set so that the first output transistor T1a is also off when a signal having the level of the second high-potential power supply VDD2 passes through the pad 26a. For example, a signal having the highest potential level among the signals passing through the pad 26a (the level of the second high-potential power supply VDD2 in the present embodiment) is provided to the back gate of the first output transistor T1a. This prevents a current from flowing through the first output transistor T1a.

A node N1 between the first and second output transistors T1a and T2a is connected to the pad 26a. The pad 26a is connected to an input terminal of the input buffer 39a, which operates at the first high-potential power supply VDD1. An output terminal of the input buffer 39a is connected to an input terminal of the input buffer 40a, which operates at the internal operating power supply VDDI. A signal DIa is output from the input buffer 40a.

In the first I/O cell 31a, one of the first and second output transistors T1a and T2a is turned on in correspondence with the level of an output signal DO0 when the signal S01 is at an L level. In this case, a signal OUTa having the level of the first high-potential power supply VDD1 or the level of the low-potential power supply VSS is generated. In this way, the first I/O cell 31a converts an output signal having the level of the internal operating power supply VDDI into a signal OUTa having the level of the first high-potential power supply VDD1.

The first I/O cell 31a controls the node N1 between the first and second output transistors T1a and T2a to be in a high impedance state when the signal S01 is at an H level. The first I/O cell 31a converts a signal having the level of the first high-potential power supply VDD1, which is provided to the pad 26a from the external semiconductor device, into a signal DIa having the level of the internal operating power supply VDDI.

The output levels of the first and second level conversion circuits 37a and 38a are set according to the level of a signal output from the second I/O cell 31b. With the outputs of the first and second I/O cells 31a and 31b being connected to the pad 26a, a signal output from the second I/O cell 31b is provided to the drains of the output transistors T1a and T2a included in the first I/O cell 31a. When a signal having the level of the first high-potential power supply VDD1 is provided to the gate of the output transistor T1a from the level conversion circuit 37a, the source-drain-gate potential causes the output transistor T1a to be on, so that a current flows from the pad 26a toward the first high-potential power supply VDD1. To prevent such current from flowing, the potential of the gate of the output transistor T1a is set at the level of the signal provided to the pad 26a (at the level of the second high-potential power supply VDD2 in the present embodiment). To be specific, a signal having the level of the second high-potential power supply VDD2 is provided to the gate of the output transistor T1a from the level conversion circuit 37a.

The following describes the second I/O cell 31b.

The second I/O cell 31b includes two logic circuits 35b and 36b, two level conversion circuits 37b and 38b, two input buffers 39b and 40b, and two output transistors T1b and T2b.

Each of the logic circuits 35b and 36b is provided with a signal S02 and an output signal DO0. The first logic circuit 35b generates an inversion signal of the output signal DO0 in response to an L level signal S02, and generates an H level signal in response to an H level signal S02. The second logic circuit 36b generates an inversion signal of the output signal DO0 in response to an L level signal S02, and generates an L level signal in response to an H level signal S02.

The first level conversion circuit 37b converts an input signal having the level of the internal operating power supply VDDI (an output signal of the first logic circuit 35b), into an input signal having the level of the second high-potential power supply VDD2. The second level conversion circuit 38b converts an input signal having the level of the internal operating power supply VDDI (an output signal of the second logic circuit 36b), into an input signal having the level of the second high-potential power supply VDD2.

The first output transistor T1b is a PMOS transistor. The second output transistor T2b is an NMOS transistor. The first output transistor T1b has its source connected to the second high-potential power supply VDD2, its drain connected to the second output transistor T2b, its gate provided with an output signal of the first level conversion circuit 37b, and its back gate connected to the second high-potential power supply VDD2. The second output transistor T2b has its source connected to the low-potential power supply VSS, its drain connected to the first output transistor T1b, its gate provided with an output signal of the second level conversion circuit 38b, and its back gate connected to the low-potential power supply VSS. A node N2 between the first and second output transistors T1b and T2b is connected to the pad 26a.

The pad 26a is connected to an input terminal of the input buffer 39b, which operates at the second high-potential power supply VDD2. An output terminal of the input buffer 39b is connected to an input terminal of the input buffer 40b, which operates at the internal operating power supply VDDI. A signal DIb is output from the input buffer 40b.

In the second I/O cell 31b, one of the first and second output transistors T1b and T2b is turned on in correspondence with the level of an output signal DO0 when the signal S02 is at an L level. In this case, a signal OUTb having the level of the second high-potential power supply VDD2 or the level of the low-potential power supply VSS is generated. In this way, the second I/O cell 31b converts an output signal having the level of the internal operating power supply VDDI into a signal having the level of the second high-potential power supply VDD2.

The second I/O cell 31b controls the node N2 between the first and second output transistors T1b and T2b to be in a high impedance state when the signal S02 is at an H level. Here, the second I/O cell 31b converts a signal having the level of the second high-potential power supply VDD2, which is provided to the pad 26a from the external semiconductor device, into a signal DIb having the level of the internal operating power supply VDDI.

Figure 5:
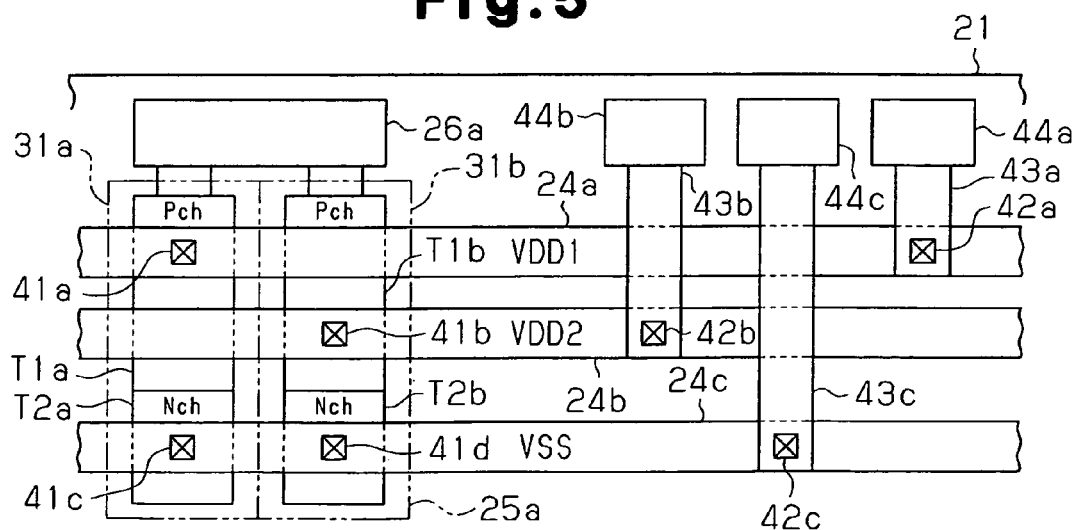
FIG. 5 is a schematic diagram showing a part of the semiconductor device of FIG. 2.

FIG. 5 is a schematic diagram showing part of the semiconductor device 21.

Figure 2:
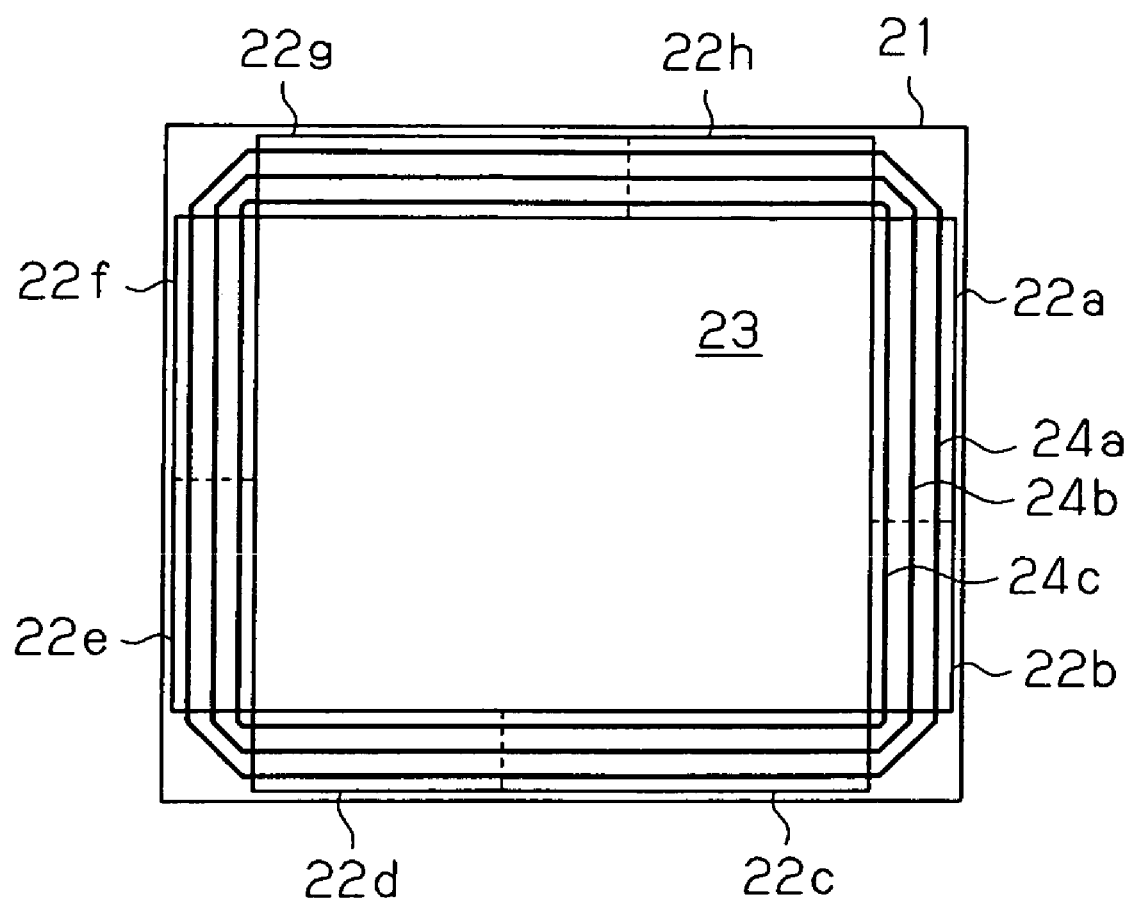
FIG. 2 is a schematic diagram of a semiconductor device of the present invention.

The power supply wirings 24a to 24c described with reference to FIG. 2 are formed on the periphery of the semiconductor device 21. Also, the pad 26a shown in FIG. 4, and the I/O circuit 25a corresponding to the pad 26a are arranged on the periphery of the semiconductor device 21. The first and second I/O cells 31a and 31b included in the I/O circuit 25a are arranged along the power supply wirings 24a to 24c.

The output transistors T1a and T2a included in the first I/O cell 31a are arranged in the direction perpendicular to the power supply wirings 24a to 24c. The output transistors T1b and T2b included in the second I/O cell 31b are arranged in the direction perpendicular to the power supply wirings 24a to 24c.

The output transistor T1a, which is a PMOS transistor (referred to as "Pch" in FIG. 5), is connected to the wiring 24a for providing the first high-potential power supply VDD1, via a contactor 41a. The output transistor T1b, which is a PMOS transistor, is connected to the wiring 24b for providing the second high-potential power supply VDD2, via a contactor 41b. The output transistors T2a and T2b, which are NMOS transistors (referred to as "Nch"), are connected to the wiring 24c for providing the low-potential power supply VSS, via contactors 41c and 41d, respectively.

In the semiconductor device 21, the power supply wiring 24a is connected to a pad 44a via a contactor 42a and wiring 43a, the power supply wiring 24b is connected to a pad 44b via a contactor 42b and wiring 43b, and the power supply wiring 24c is connected to a pad 44c via a contactor 42c and wiring 43c. A device external to the semiconductor device 21 provides the pads 44a, 44b, and 44c, via wires, with the power supplies VDD1, VDD2, and VSS respectively.

At least one of the high-potential power supplies VDD1 and VDD2 may not be provided from the external device. For example, the semiconductor device 21 may be provided with the first high-potential power supply VDD1, and a voltage step-up circuit included in the internal circuit 23 may generate the second high-potential power supply VDD2 based on the first high-potential power supply VDD1. Alternatively, the internal circuit 23 may generate the first and second high-potential power supplies VDD1 and VDD2 based on the internal operating power supply VDDI, which is the operating voltage of the internal circuit 23.

The following describes the operation of the I/O circuit 25a.

When the control signal CIO is at an L level and the voltage selection signal VSEL is at an L level, the first and second output transistors T1a and T2a in the first I/O cell 31a are controlled on and off according to the level of the output signal DO0. The second I/O cell 31b sets the node N2 between the first and second output transistors T1b and T2b in a high impedance state (turns off both the transistors T1b and T2b). The I/O circuit 25a operates using, as the operating voltage, the first high-potential power supply VDD1, which is connected to the source of the output transistor T1a included in the first I/O cell 31a.

When the control signal CIO is at an L level and the voltage selection signal VSEL is at an H level, the first I/O cell 31a sets the node N1 between the first and second output transistors T1a and T2a in a high impedance state (turns off both the transistors T1a and T2a). The first and second output transistors T1b and T2b in the second I/O cell 31b are controlled on and off according to the level of the output signal DO0. The I/O circuit 25a operates using, as the operating voltage, the second high-potential power supply VDD2, which is connected to the source of the output transistor T1b included in the second I/O cell 31b.

When the control signal CIO is at an H level, the first I/O cell 31a sets the node N1 between the first and second output transistors T1a and T2a in a high impedance state, and the second I/O cell 31b sets the node N2 between the first and second output transistors T1b and T2b in a high impedance state. The selector circuit 34 generates a signal DI0 having substantially the same level as the level of the signals DIa and DIb, which are output from one of the first and second I/O cells 31a and 31b, in response to the voltage selection signal VSEL.

The semiconductor device 21 of the first embodiment has the advantages described below.

The I/O circuit 25a includes the first I/O cell 31a that operates at the first high-potential power supply VDD1 and the second I/O cell 31b that operates at the second high-potential power supply VDD2. According to the voltage selection signal VSEL0, the I/O circuit 25a selectively activates the first and second I/O cells 31a and 31b. A signal according to the operating voltage of the selected one of the first and second I/O cells 31a and 31b (the first high-potential power supply VDD1 or the second high-potential power supply VDD2) is generated. As a result, the operating voltage of the I/O circuit 25a is easily changed.

Figure 6:
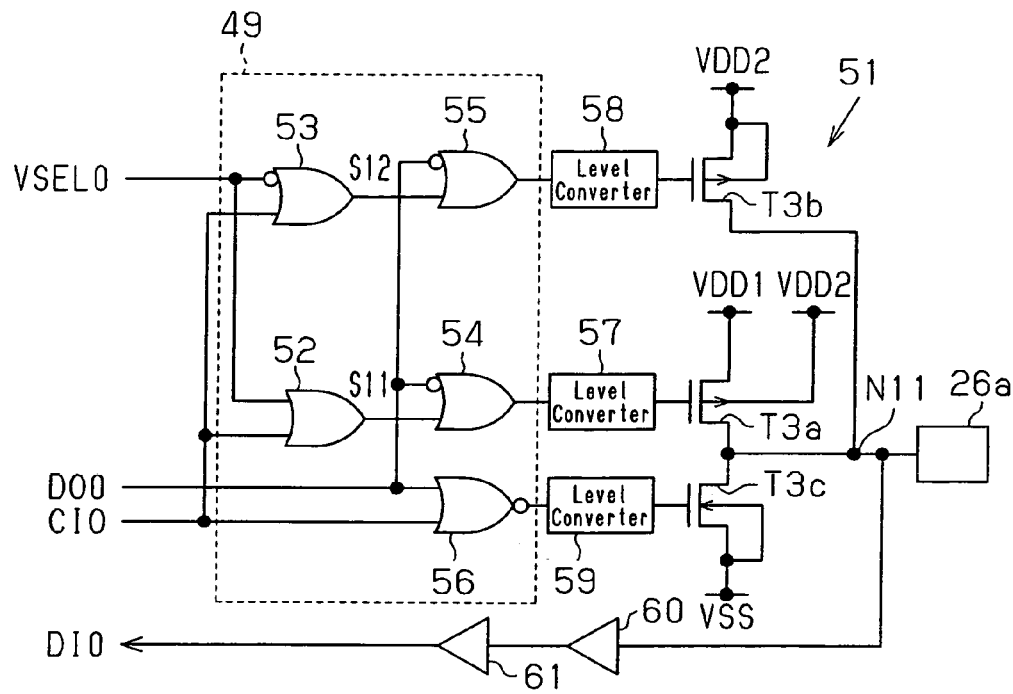
FIG. 6 is a circuit diagram of an I/O circuit included in the I/O block of FIG. 3 according to a second embodiment of the present invention.
Figure 7:
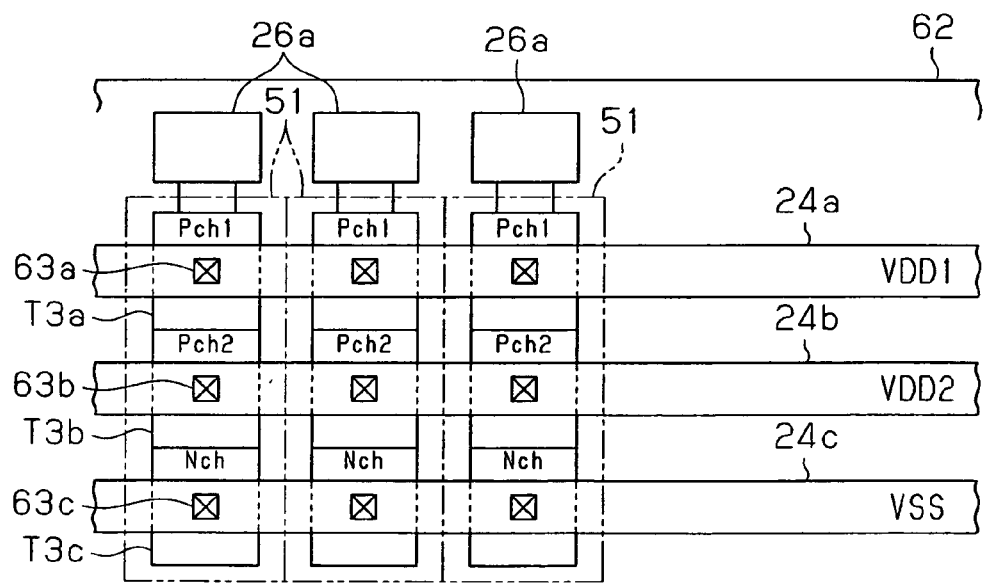
FIG. 7 is a schematic layout diagram of the I/O circuits of FIG. 6.

The following describes a semiconductor device according to a second embodiment of the present invention, with reference to FIGS. 6 and 7.

FIG. 6 is a circuit diagram of an I/O circuit 51 included in the semiconductor device according to the second embodiment. The I/O circuit 51 is replaceable with each of the I/O circuits 25a to 25e shown in FIG. 3.

The I/O circuit 51 includes five logic circuits 52 to 56, three level conversion circuits 57 to 59, two input buffers 60 and 61, and three output transistors T3a to T3c. The logic circuits 52 to 56 form a control circuit 49.

Each of the first and second logic circuits 52 and 53 is provided with a voltage selection signal VSEL0 and a control signal CIO. The first logic circuit 52 generates a signal S11 having substantially the same level as the level of a control signal CIO in response to an L level voltage selection signal VSEL0, and generates an H level signal S11 in response to an H level voltage selection signal VSEL0. The second logic circuit 53 generates a signal S12 having substantially the same level as the level of a control signal CIO in response to an H level voltage selection signal VSEL0, and generates an H level signal S12 in response to an L level voltage selection signal VSEL0.

The third logic circuit 54 is provided with a signal S11 and an output signal DO0. The third logic circuit 54 generates an inversion signal of the output signal DO0 in response to an L level signal S11, and generates an H level signal in response to an H level signal S11. The first level conversion circuit 57 converts an input signal having the level of the internal operating power supply VDDI (an output signal of the third logic circuit 54), into an input signal having the level of the second high-potential power supply VDD2, and provides the first output transistor T3a with the input signal resulting from the conversion.

The fourth logic circuit 55 is provided with a signal S12 and an output signal DO0. The fourth logic circuit 55 generates an inversion signal of the output signal DO0 in response to an L level signal S12, and generates an H level signal in response to an H level signal S12. The second level conversion circuit 58 converts an input signal having the level of the internal operating power supply VDDI (an output signal of the fourth logic circuit 55), into an input signal having the level of the second high-potential power supply VDD2, and provides the second output transistor T3b with the input signal resulting from the conversion.

The fifth logic circuit 56 is provided with a control signal CIO and an output signal DO0. The fifth logic circuit 56 generates an inversion signal of the output signal DO0 in response to an L level control signal CIO, and generates an L level signal in response to an H level control signal CIO. The third level conversion circuit 59 converts an input signal having the level of the internal operating power supply VDDI (an output signal of the fifth logic circuit 56), into an input signal having the level of the second high-potential power supply VDD2, and provides the third output transistor T3c with the input signal resulting from the conversion.

The first output transistor T3a is a PMOS transistor. The first output transistor T3a has its source connected to the first high-potential power supply VDD1, its gate provided with an output signal of the first level conversion circuit 57, and its back gate connected to the second high-potential power supply VDD2. In this way, the first output transistor T3a is a transistor connected to a high-potential power supply.

The second output transistor T3b is a PMOS transistor. The second output transistor T3b has its source connected to the second high-potential power supply VDD2, its gate provided with an output signal of the second level conversion circuit 58, and its back gate connected to the second high-potential power supply VDD2. In this way, the second output transistor T3b is a transistor connected to a high-potential power supply.

The third output transistor T3c is an NMOS transistor. The third output transistor T3c has its source connected to the low-potential power supply VSS, its gate provided with an output signal of the third level conversion circuit 59, and its back gate connected to the low-potential power supply VSS. In this way, the third output transistor T3c is a transistor connected to a low-potential power supply.

The drains of the first to third output transistors T3a to T3c are connected to one another. A node N11 between the drains of the first to third output transistors T3a to T3c is connected to a pad 26a. The pad 26a is connected to an input terminal of the input buffer 60, which operates at the second high-potential power supply VDD2. An output terminal of the input buffer 60 is connected to an input terminal of the input buffer 61, which operates at the internal operating power supply VDDI. The input buffer 61 generates a signal DI0.

The following describes the operation of the I/O circuit 51.

When the control signal CIO is at an L level and the voltage selection signal VSEL is at an L level, the I/O circuit 51 turns off the second output transistor T3b, and turns on or off the first and third output transistors T3a and T3c according to the level of the output signal DO0. Thus, the I/O circuit 51 operates as an output circuit using, as the operating voltage, the first high-potential power supply VDD1, which is connected to the source of the first output transistor T3a. The I/O circuit 51 generates a signal having the level of the first high-potential power supply VDD1 or the level of the low-potential power supply VSS.

When the control signal CIO is at an L level and the voltage selection signal VSEL is at an H level, the I/O circuit 51 turns off the first output transistor T3a, and turns on or off the second and third output transistors T3b and T3c according to the level of the output signal DO0. Thus, the I/O circuit 51 operates as an output circuit using, as the operating voltage, the second high-potential power supply VDD2, which is connected to the source of the second output transistor T3b. The I/O circuit 51 generates a signal having the level of the second high-potential power supply VDD2 or the level of the low-potential power supply VSS.

When the control signal CIO is at an H level, the I/O circuit 51 turns off the output transistors T3a to T3c, and sets the node N11 in a high impedance state. The first input buffer 60 converts a signal provided to the pad 26a, into a signal having the level of the second high-potential power supply VDD2 or into a signal having the level of the low-potential power supply VSS. The second input buffer 61 converts an input signal into a signal having the level of the internal operating power supply VDDI or into a signal having the level of the low-potential power supply VSS, to generate a signal DI0.

FIG. 7 is a schematic diagram showing part of a semiconductor device 62.

A plurality of (three in the figure) I/O circuits 51 and pads 26a are arranged on the periphery of the semiconductor device 62. Power supply wirings 24a to 24c are arranged on the I/O circuits 51. The output transistors T3a to T3c included in each I/O circuit 51 are arranged in the direction perpendicular to the power supply wirings 24a to 24c.

The wiring 24a for providing the first high-potential power supply VDD1 is arranged above the output transistors T3a, which are PMOS transistors (referred to as "Pch" in FIG. 7). Each output transistor T3a is connected to the wiring 24a via a contactor 63a. The wiring 24b for providing the second high-potential power supply VDD2 is arranged above the output transistors T3b, which are PMOS transistors. Each output transistor T3b is connected to the wiring 24b via a contactor 63b. The wiring 24c for providing the low-potential power supply VSS is arranged above the output transistors T3c, which are NMOS transistors (referred to as "Nch" in FIG. 7). Each output transistor T3c is connected to the wiring 24c via a contactor 63c.

Although the output transistors T3a to T3c included in each I/O circuit 51 are shown as adjacent to one another in FIG. 7, the output transistors T3a to T3c are actually formed in different wells, which are isolated from one another by their conductivity types and power supply voltages. The output transistors T3a arranged along the power supply wiring 24a have the same conductivity type, and operate at the same power supply voltage. For example, each of the output transistors T3a arranged along the power supply wiring 24a is a PMOS transistor, and has its source connected to the first high-potential power supply VDD1 (refer to FIG. 6). Thus, the output transistors T3a are formed in one well.

In the same manner, the output transistors T3b arranged along the power supply wiring 24b have the same conductivity type, and operate at the same power supply voltage. Thus, the output transistors T3b are formed in one well. Further, the output transistors T3c arranged along the power supply wiring 24c have the same conductivity type, and operate at the same power supply voltage. Thus, the output transistors T3c are formed in one well.

The output transistors T3a to T3c included in the I/O circuits 51 are arranged along the power supply wirings 24a to 24c in correspondence with their conductivity types and power supply voltages. The output transistors T3a arranged in a row along the power supply wiring 24a are formed in one well. The output transistors T3b arranged in a row along the power supply wiring 24b are formed in one well. The output transistors T3c arranged in a row along the power supply wiring 24c are formed in one well. These three wells in which the output transistors T3a to T3c are respectively formed are actually isolated from one another.

In this way, the output transistors T3a to T3c are formed so that the output transistors in the same row are in the same well. This increases the area of wells, compared with conventional examples. Thus, the semiconductor device 62 has an improved electrostatic discharge (ESD) withstand voltage. The ESD withstand voltage depends on the area of wells. To be specific, the ESD withstand voltage decreases as the area of the wells decreases.

In the second embodiment, the PMOS transistors are designed to be larger than the NMOS transistors. Compared with the I/O circuit 25a of the first embodiment, the I/O circuit 51 of the second embodiment has a narrower width in the direction where the power supply wirings 24a to 24c extend, and has a wider width in the direction perpendicular to the power supply wirings 24a to 24c. Thus, the I/O circuit 51 has a narrower width with respect to one pad 26a compared with the output circuit of the first embodiment. This structure enables a larger number of I/O circuits 51 to be arranged on the periphery of the semiconductor device 62, compared with the semiconductor device of the first embodiment.

The semiconductor device of the second embodiment has the advantages described below.

(1) The I/O circuit 51 includes the first and second output transistors T3a and T3b, which are PMOS transistors, and the third output transistor T3c, which is an NMOS transistor. The drain of the third output transistor T3c is connected to the drains of the first and second output transistors T3a and T3b. The third output transistor T3c is commonly used by the first and second output transistors T3a and T3b. This structure prevents an increase in the circuit area of the semiconductor device. (2) The first to third output transistors T3a to T3c included in the I/O circuit 51 are arranged in the direction perpendicular to the power supply wirings 24a to 24c. The I/O circuits 51 are arranged along the power supply wirings 24a to 24c. The output transistors T3a to T3c are arranged so that the transistors with the same conductivity type are in the same row along the power supply wirings. Among the output transistors T3a to T3c included in the I/O circuits 51, the transistors with the same conductivity type are formed in the same well. This structure increases the area of each well, and improves the ESD withstand voltage of the semiconductor device.

Figure 8:
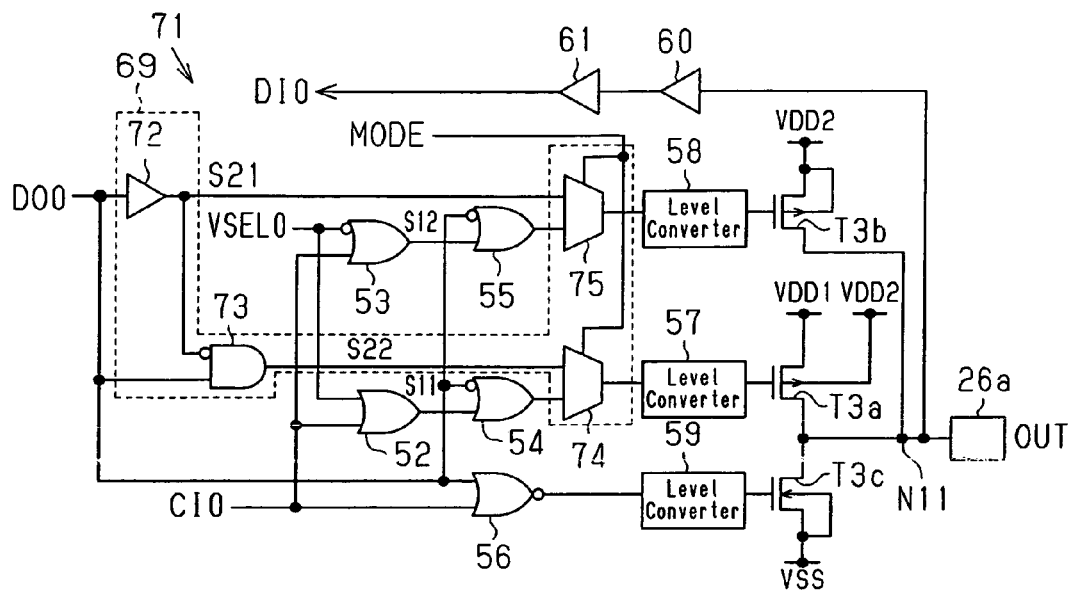
FIG. 8 is a circuit diagram of an I/O circuit included in the I/O block of FIG. 3 according to a third embodiment of the present invention.
Figure 9:
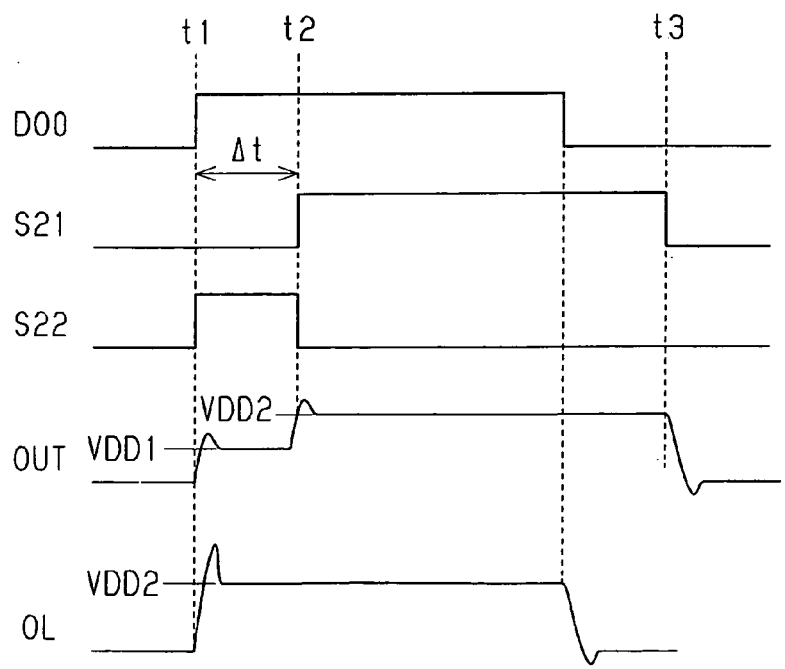
FIG. 9 is an operation waveform diagram of the I/O circuit of FIG. 8.

The following describes a semiconductor device according to a third embodiment of the present invention, with reference to FIGS. 8 and 9.

FIG. 8 is a circuit diagram of an I/O circuit 71. The I/O circuit 71 is replaceable with, for example, each of the I/O circuits 25a to 25e shown in FIG. 3.

The I/O circuit 71 includes five logic circuits 52 to 56, three level conversion circuits 57 to 59, two input buffers 60 and 61, three output transistors T3a to T3c, a delay circuit 72, a logic circuit 73, and two selector circuits 74 and 75.

The delay circuit 72 receives an output signal DO0, and generates a delay signal S21 by delaying the output signal DO0 by a predetermined time Δt.

The logic circuit 73 is provided with an output signal DO0 and a delay signal S21. The logic circuit 73 generates a signal S22 having substantially the same level as the level of the output signal DO0 when the delay signal S21 is at an L level, and generates an L level signal S22 when the delay signal S21 is at an H level. The delay signal S21 is a signal resulting from delaying the output signal DO0 by the predetermined time Δt. As shown in FIG. 9, the logic circuit 73 generates a signal S22, which is maintained at an H level only for the predetermined time Δt from the rise of the output signal DO0.

The first selector circuit 74 is provided with a mode signal MODE as a control signal. The first selector circuit 74 is also provided with a signal S22 and an output signal of the third logic circuit 54. The first selector circuit 74 selects the signal S22 or the output signal of the third logic circuit 54 according to the mode signal MODE, and generates a signal having substantially the same level as the level of the selected signal. For example, the first selector circuit 74 selects the signal S22 in response to an H level mode signal MODE, and selects the output signal of the third logic circuit 54 in response to an L level mode signal MODE.

The second selector circuit 75 is provided with a mode signal MODE as a control signal. The second selector circuit 75 is also provided with a delay signal S21 and an output signal of the fourth logic circuit 55. The second selector circuit 75 selects the delay signal 21 or the output signal of the fourth logic circuit 55 according to the mode signal MODE, and generates a signal having substantially the same level as the level of the selected signal. For example, the second selector circuit 75 selects the signal S21 in response to an H level mode signal MODE, and selects the output signal of the fourth logic circuit 55 in response to an L level mode signal MODE.

The mode signal MODE is used to reduce overshoot, which may occur at the rise of an output signal. The mode signal MODE is set at an H level or at an L level by, for example, pulling up or pulling down a pad, which is not shown.

When the mode signal MODE is set at an L level, the first selector circuit 74 selects the output signal of the third logic circuit 54, and the second selector circuit 75 selects the output signal of the fourth logic circuit 55. The first and second selector circuits 74 and 75 respectively provide the output transistors T3a and T3b with the selected output signals. The delay circuit 72, the logic circuit 73, and the selector circuits 74 and 75 included in the I/O circuit 71 form a control circuit 69, which switches the operating power supply to the first high-potential power supply VDD1 or to the second high-potential power supply VDD2 according to the voltage selection signal VSEL0, and controls the I/O circuit 71 to operate as an input circuit or as an output circuit according to the control signal CIO.

When the mode signal MODE is set at an H level, the first selector circuit 74 selects the signal S22 output from the logic circuit 73, and the second selector circuit 75 selects the delay signal S21 output from the delay circuit 72. The first and second selector circuits 74 and 75 respectively provide the output transistors T3a and T3b with the selected signals. As shown in FIG. 9, the signal S22 is maintained at an H level only for the predetermined time Δt in response to the rise of the output signal DO0 (time t1). The delay signal S21 is a signal resulting from delaying the output signal DO0 by the predetermined time Δt.

The output transistors T3a and T3b are PMOS transistors. From time t1 to time t2, the first output transistor T3a is on in response to the signal S22 whose level has been converted by the first level conversion circuit 57, and the second output transistor T3b is off in response to the delay signal S21 whose level has been converted by the second level conversion circuit 58. From time t2 to time t3, the first output transistor T3a is off in response to the signal S22 whose level has been converted, and the second output transistor T3b is on in response to the delay signal S21 whose level has been converted.

To be specific, when provided with an H level output signal DO0, the I/O circuit 71 first turns on the output transistor T3a. When the predetermined time Δt elapses, the I/O circuit 71 turns off the first output transistor T3a and turns on the second output transistor T3b. The delay circuit 72 and the logic circuit 73 form a control circuit that controls on and off of the output transistors T3a and T3b at different timings.

The output transistors T3a and T3b being turned on and off cause the voltage of the output signal OUT (the level at the pad 26a) to first rise from the level of the low-potential power supply VSS to the level of the first high-potential power supply VDD1, and then rise from the level of the first high-potential power supply VDD1 to the level of the second high-potential power supply VDD2.

In this way, the voltage of the output signal OUT rises from the level of the low-potential power supply VSS to the level of the second high-potential power supply VDD2 in a stepwise manner. The potential difference between adjacent steps is smaller than the potential difference between the low-potential power supply VSS and the second high-potential power supply VDD2. A first overshoot occurs when the voltage of the output signal rises from the level of the low-potential power supply VSS to the level of the first high-potential power supply VDD1. The level of the first overshoot corresponds to the voltage difference between the first high-potential power supply VDD1, which is a targeted voltage level, and the highest level of the output signal OUT to which the overshoot has occurred. A second overshoot occurs when the voltage of the output signal rises from the level of the first high-potential power supply VDD1 to the level of the second high-potential power supply VDD2. The level of the first overshoot and the level of the second overshoot are both lower than the level of an overshoot occurring when the voltage of an output signal OL (refer to FIG. 9) rises from the level of the low-potential power supply VSS to the level of the second high-potential power supply VDD2.

In addition to the advantages described in the second embodiment, the semiconductor device of the third embodiment has the advantages described below.

The I/O circuit 71 turns on the first output transistor T3a and the second output transistor T3b at timings that differ by the predetermined time Δt, according to the mode signal MODE. The first output transistor T3a is provided with the first high-potential power supply VDD1. When the predetermined time Δt elapses, the second output transistor T3b is provided with the second high-potential power supply VDD2. The voltage of the output signal OUT of the I/O circuit 71 rises from the level of the low-potential power supply VSS to the level of the second high-potential power supply VDD2 in a stepwise manner. Thus, an overshoot occurring with the output signal OUT is smaller than an overshoot occurring with the output signal OL whose voltage directly rises from the level of the low-potential power supply VSS to the level of the second high-potential power supply VDD2.

In the above embodiments, the operating voltage of the I/O circuits 25a to 25e, 51, and 71 is set using the voltage selection signal VSEL, and the level of an external output signal is changed to the first high-potential power supply VDD1 or to the second high-potential power supply VDD2. However, the signal level may be changed by other methods.

Figure 10:
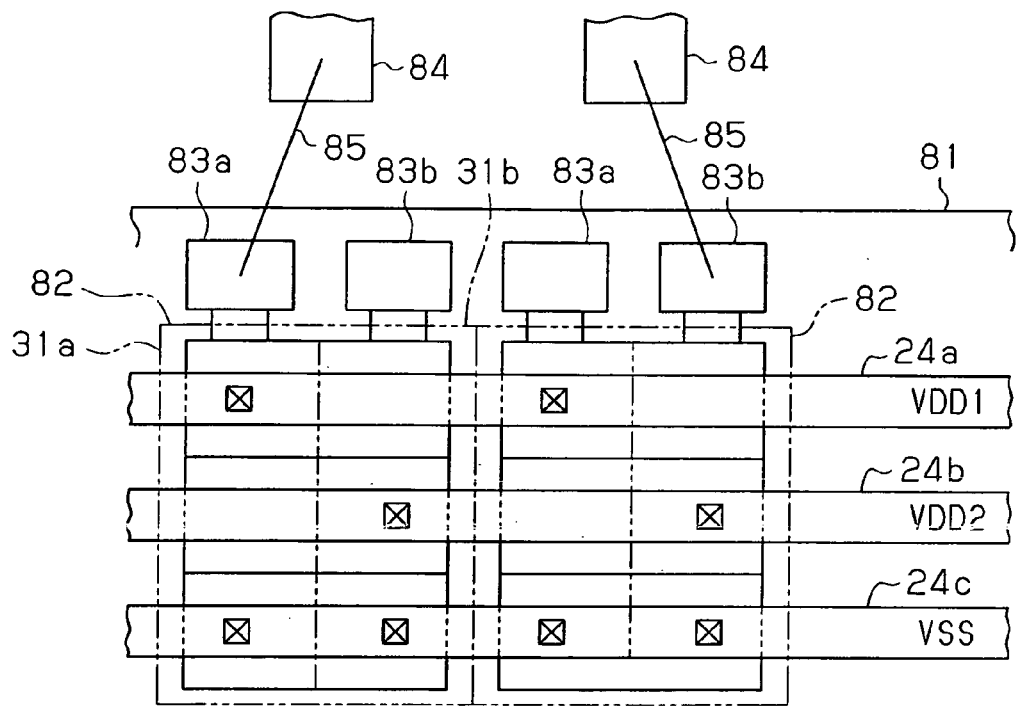
FIG. 10 is a schematic layout diagram of I/O circuits according to a first modification.

For example, a semiconductor device 81 shown in FIG. 10 includes I/O circuits 82, each of which includes a first and second I/O cells 31a and 31b having the same structure as the corresponding components in the first embodiment. The I/O circuit 82 does not include a component corresponding to the control circuit 28 in the I/O circuit 25a of the first embodiment. The first and second I/O cells 31a and 31b receive an output signal DO0, and operate at the same timing.

The first I/O cell 31a is connected to a pad 83a. The second I/O cell 31b is connected to a pad 83b. To be specific, the node N1 between the output transistors T1a and T2a included in the first I/O cell 31a shown in FIG. 4 is connected to the pad 83a shown in FIG. 10, and the node N2 between the output transistors T1b and T2b included in the second I/O cell 31b is connected to the pad 83b shown in FIG. 10. Thus, the first pad 83a is provided with a signal having the level of the first high-potential power supply VDD1 from the first I/O cell 31a, and the second pad 83b is provided with a signal having the level of the second high-potential power supply VDD2 from the second I/O cell 31b. One of the two pads 83a and 83b is connected to another semiconductor device. In FIG. 10, for example, a lead frame 84 is selectively connected to the first and second pads 83a and 83b via a wire 85. This structure enables the operating voltage of the I/O circuit to be changed without requiring a mask for forming the semiconductor device 81 to be newly created, and prevents an increase in the manufacturing cost of the semiconductor device. Also, this structure only requires the connection target of the wire 85 to be changed in the process for connecting the wire 85. This structure does not increase the number of manufacturing processes, and prevents an increase in the number of days required to manufacture the semiconductor device.

Figure 11:
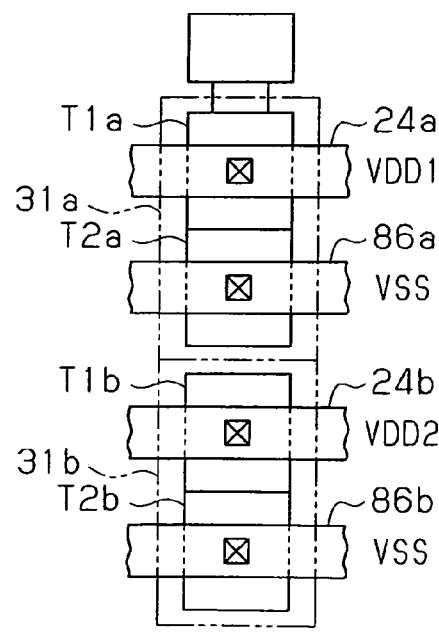
FIG. 11 is a schematic layout diagram of output transistors included in an I/O circuit according to a second modification.

In the first embodiment, the first and second I/O cells 31*a* and 31*b* may be arranged in the direction perpendicular to the power supply wirings 24*a* to 24*c* as shown in FIG. 11, instead of being arranged along the power supply wirings 24*a* to 24*c*. In this case, a power supply wiring 86*a* for the low-potential power supply VSS needs to be arranged in the output transistor (NMOS transistor) T2*a* included in the I/O cell 31*a*, and a power supply wiring 86*b* for the low-potential power supply VSS needs to be arranged in the output transistor (NMOS transistor) T2*b* included in the I/O cell 31*b*. However, this structure enables the output transistor (PMOS transistors) T1*a* included in the first I/O cell 31*a* to be arranged along the power supply wiring 24*a* for the first high-potential power supply VDD1, and the output transistor (PMOS transistor) T1*b* included in the second I/O cell 31*b* to be arranged along the power supply wiring 24*b* for the second high-potential power supply VDD2. As in the second embodiment, this structure enables the output transistors T1*a* included in different I/O cells to be formed in one well, and the output transistors T1*b* included in different I/O cells to be formed in another well. This structure enables the semiconductor device including the I/O cells 31*a* and 31*b* according to the first embodiment, too, to have an improved ESD withstand voltage.

In the above embodiments, the voltage selection signal VSEL may be generated inside the semiconductor device.

Figure 12A:
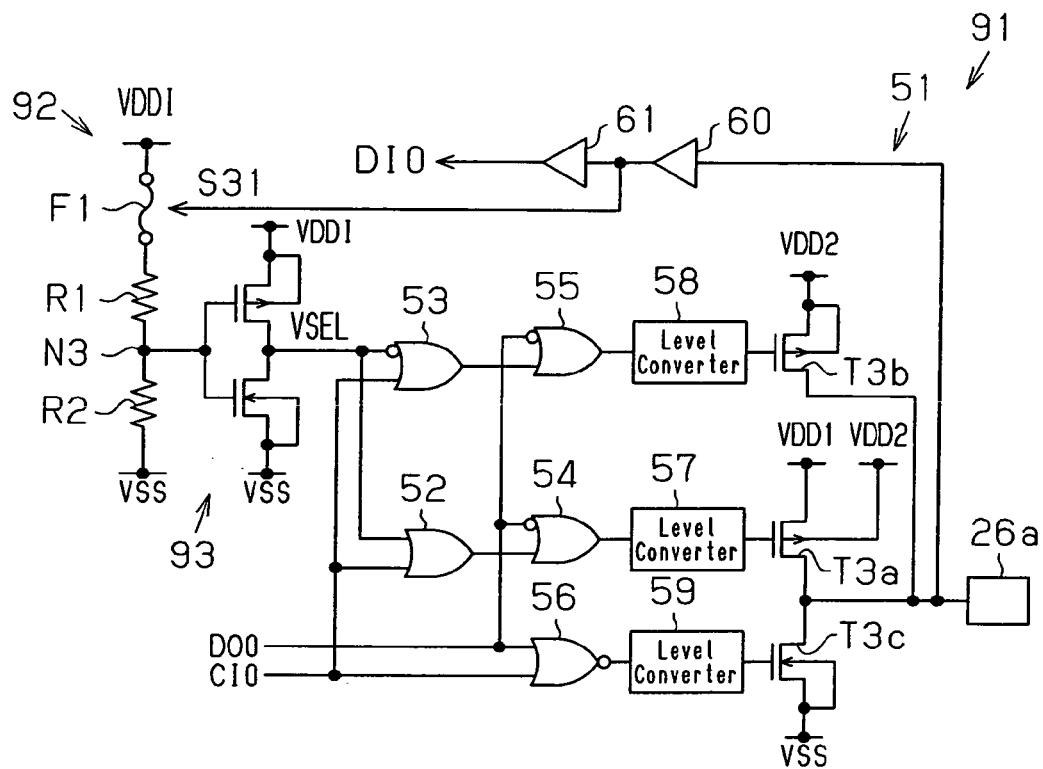
FIG. 12(a) is a circuit diagram of an I/O circuit according to a third modification.
Figure 12B:
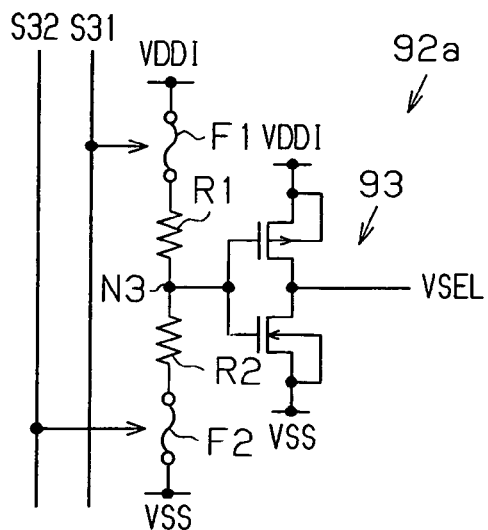
FIG. 12(b) is a circuit diagram showing a modified example of a part of the I/O circuit of FIG. 11.

For example, a semiconductor device 91 shown in FIG. 12(*a*), which includes the I/O circuit 51, includes a signal generation circuit 92. The signal generation circuit 92 includes a fuse F1. A first terminal of the fuse F1 is connected to the internal operating power supply VDDI, and a second terminal of the fuse F1 is connected to a first terminal of a resistor R1. A second terminal of the resistor R1 is connected to a first terminal of a resistor R2. A second terminal of the resistor R2 is connected to the low-potential power supply VSS. A node N3 between the resistors R1 and R2 is connected to an inverter circuit 93. A voltage selection signal VSEL is output from the inverter circuit 93. The fuse F1 is broken when an output signal S31 of the input buffer 60 is at the level of the second high-potential power supply VDD2, and is not broken when the output signal S31 is at the level of the first high-potential power supply VDD1.

The fuse F1 is not broken when a signal having the level of the first high-potential power supply VDD1 is provided from a semiconductor device (not shown) connected to the pad 26*a*. In this case, the signal generation circuit 92 generates the voltage selection signal VSEL at an L level. The I/O circuit 51 operates using the first high-potential power supply VDD1 as its driving power supply. The fuse F1 is broken when a signal having the level of the second high-potential power supply VDD2 is provided to the pad 26*a*. In this case, the signal generation circuit 92 generates an H level voltage selection signal VSEL. The I/O circuit 51 operates using the second high-potential power supply VDD2 as its driving power supply.

In this way, the operating voltage of the I/O circuit 51 is automatically set according to a signal provided from an external semiconductor device connected to the pad 26*a*.

Also, the voltage selection signal VSEL is generated to have a level according to whether the fuse F1 is broken or not. This eliminates the need for the initial setting.

The signal generation circuit may, for example, have a structure as shown in FIG. 12(*b*). A signal generation circuit 92*a* includes two fuses F1 and F2, and resistors R1 and R2. The fuse F1 is connected to the internal operating power supply VDDI. The fuse F2 is connected to the low-potential power supply VSS. The resistors R1 and R2 are connected between the fuses F1 and F2. The fuse F1 is broken by the current from a signal S31 when the first high-potential power supply VDD1 is used as the operating power supply. The fuse F2 is broken by the current from a signal S32 when the second high-potential power supply VDD2 is used as the operating power supply. It is preferable that the current breaking the first fuse F1 and the current breaking the second fuse F2 be provided via different pads. Providing the currents in this way reliably enables the first and second fuses F1 and F2 to be broken. Alternatively, the fuses F1 and F2 may be broken by a laser or the like before the semiconductor device is assembled.

The signal generation circuits 92 and 92*a* may be integrated in the I/O circuits 25*a* to 25*e* in the first embodiment, or in the I/O circuit 71 in the third embodiment.

In the above embodiments, information for setting the voltage selection signal VSEL (setting information) may be stored, and the operating voltage of the I/O circuit may be set based on the setting information. It is preferable that the setting information be stored in a register formed by a flip-flop etc., or in such a memory as an SRAM (static random access memory).

Figure 13:
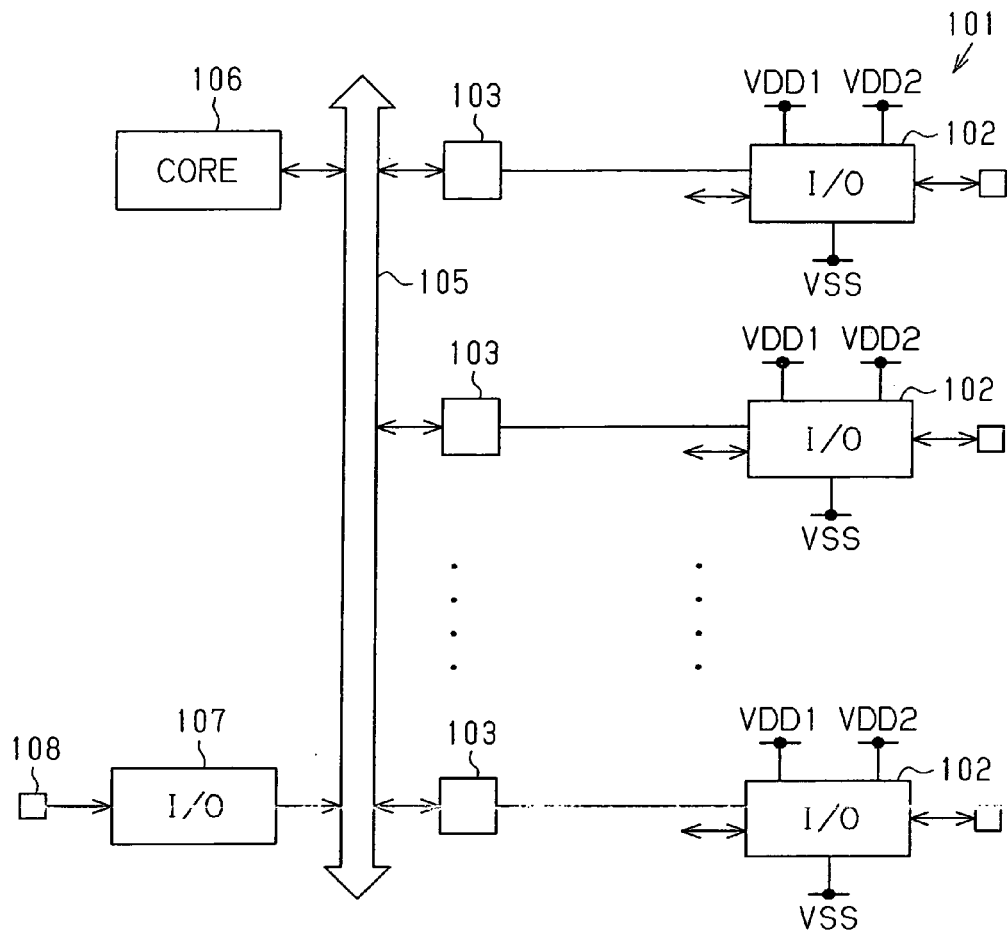
FIG. 13 is a schematic block diagram showing a part of a semiconductor device according to a fourth modification.

For example, a semiconductor device 101 shown in FIG. 13 includes a plurality of registers 103, each connected to one of a plurality of I/O circuits 102 (e.g., I/O circuits having the same structure as the structure of the I/O circuit 51 in the second embodiment). The registers 103 are connected to a bus 105. A CPU core (CORE) 106, which functions as an internal circuit, and an I/O circuit 107 are connected to the bus 105. The I/O circuit 107 is connected to a pad 108. The I/O circuit 107 may have a different structure from or the same structure as the structure of the I/O circuits 102. The CPU core 106 receives setting information for each I/O circuit 102 via the pad 108, the I/O circuit 107, and the bus 105, and stores the setting information into the corresponding register 103. Each register 103 provides a voltage selection signal VSEL based on the setting information stored therein, to the corresponding I/O circuit 102. In this way, appropriately changing setting information stored in each register 103 enables the operating voltage of each I/O circuit 102 to be easily changed. Also, the setting information for each of the I/O circuits 102 is provided via one pad 108. In this way, this structure prevents an increase in the number of pads.

Figure 14:
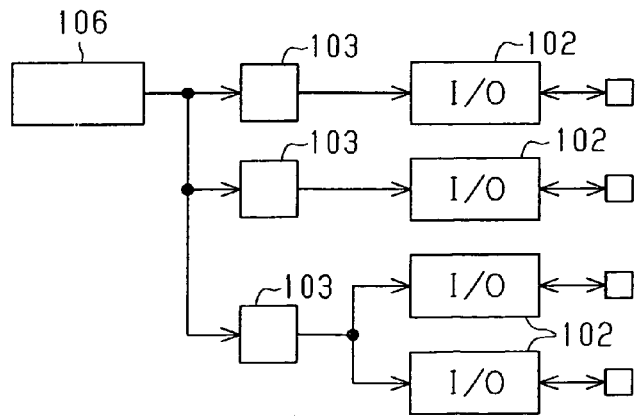
FIG. 14 is a schematic block diagram showing a first modified example of a part of the semiconductor device of FIG. 13.

The method of generating a voltage selection signal based on setting information may be applied to a semiconductor device that does not include the bus 105. Further, one register 103 may be connected to a plurality of I/O circuits 102 as shown in FIG. 14, or one register may be connected to one I/O block. In this way, the operating voltage of a plurality of I/O circuits may be set based on setting information stored in one register. This structure prevents an increase in the number of registers, and prevents an increase in the circuit area of the semiconductor device.

A shift register may be used as such a register for storing setting information. For example, a semiconductor device 111 shown in FIG. 15(*a*) includes a shift register 112. The shift register 112 includes a plurality of registers 113 connected in series. Each register 113 is provided with a clock signal CLK via a pad 114 and an I/O circuit 115. The clock signal CLK is used as a shift-pulse signal. The shift register 112 sequentially transfers setting information, which is provided via the pad 116 and the I/O circuit 117, according to the clock signal CLK. In this way, the setting information is provided as serial data from one pad, and the setting information is written to the shift register. This structure prevents an increase in the number of pads, and prevents an increase in the circuit area of the semiconductor device 111. Also, the area occupied by the registers 113 is smaller than the area occupied by the bus 105 and the registers 103 shown in FIG. 13. This structure prevents an increase in the chip area.

Figure 15A:
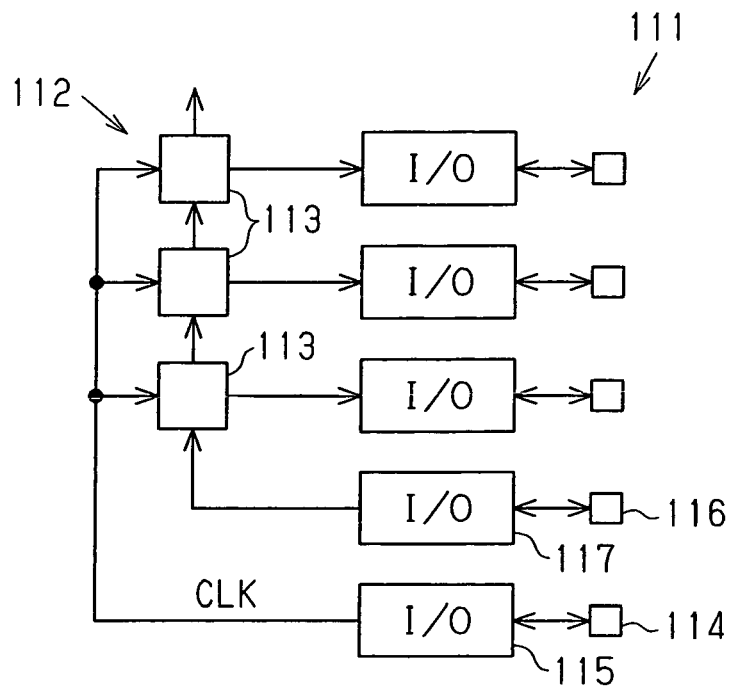
FIG. 15(a) is a schematic block diagram showing a second modified example of a part of the semiconductor device of FIG. 13.
Figure 15B:
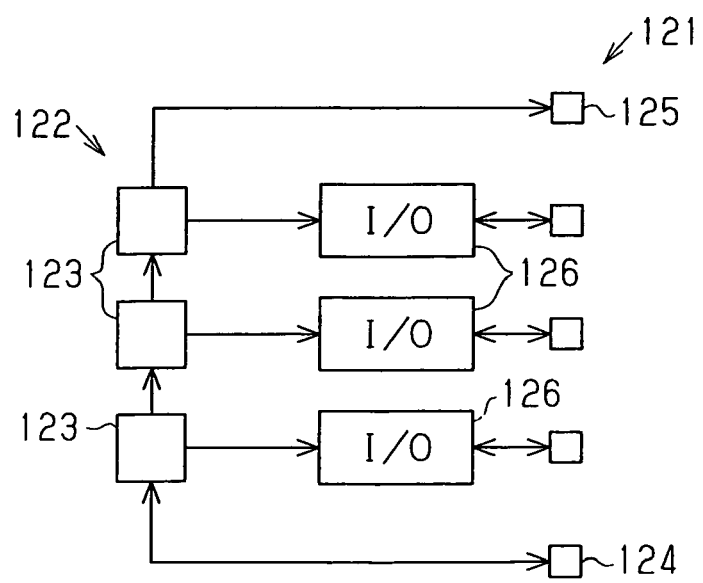
FIG. 15(b) is a schematic block diagram showing a third modified example of a part of the semiconductor device of FIG. 13.

As shown in FIG. 15(*b*), a semiconductor device 121 corresponding to a boundary-scan design may include a shift register 122. The shift register 122 includes a plurality of registers 123, which are connected between pads 124 and 125. Data is externally written to the shift register 122, to set the operation of each I/O circuit 126. Also, data stored in the shift register 123 is externally read, to check the state of each I/O circuit 126. To be specific, in the semiconductor device 121, data is externally written to the shift register 122, to set the operating voltage of each I/O circuit 126. Also, setting information stored in the shift register 122 is externally read.

The pad for each I/O circuit may be used to provide setting information. For example, a semiconductor device 131 as shown in FIG. 16(*a*) includes a pad 26*a*, which is connected not only to an I/O circuit 51 but also to a flip-flop (FF) 132 as a register. A clock input terminal of the flip-flop 132 is provided with a fetch signal SET. It is preferable that the fetch signal SET be an externally provided signal, a reset signal used at power-on (a signal provided from a reset terminal or a signal generated by an internal circuit), and an output signal of an internal counter circuit. A pull-down resistor R11, or a pull-up resistor R12 shown in FIG. 16(*b*) is connected to the pad 26*a* for setting the operating voltage of the I/O circuit 51.

When the I/O circuit 51 is set in a high impedance state, the pull-down resistor R11 or the pull-up resistor R12 connected to the pad 26*a* provides the flip-flop 132 with an L level or H level signal. For example, when the pull-down resistor R11 is connected, the flip-flop 132 outputs an L level voltage selection signal VSEL, so that the I/O circuit 51 generates a signal having the level of the first high-potential power supply VDD1. When the pull-up resistor R12 is connected, the flip-flop 132 outputs an H level voltage selection signal VSEL, so that the I/O circuit 51 generates a signal having the level of the second high-potential power supply VDD2.

The semiconductor device 131 is not required to additionally include a pad for providing the register (flip-flop 132) with setting information. This structure prevents an increase in the circuit area of the semiconductor device 131. The semiconductor device 131 simply includes the pull-down resistor R11 or the pull-up resistor R12 connected to the pad 26*a*, and is realized by a simple structure. Further, the operating voltage of the I/O circuit 51 is changed simply by changing the connection target of the resistor. In this way, the operating voltage is easily changed.

In the above embodiments, the level of a signal provided to the pad from an external semiconductor device may be determined, and the operating power supply voltage may be set based on the determined signal level.

Figure 17:
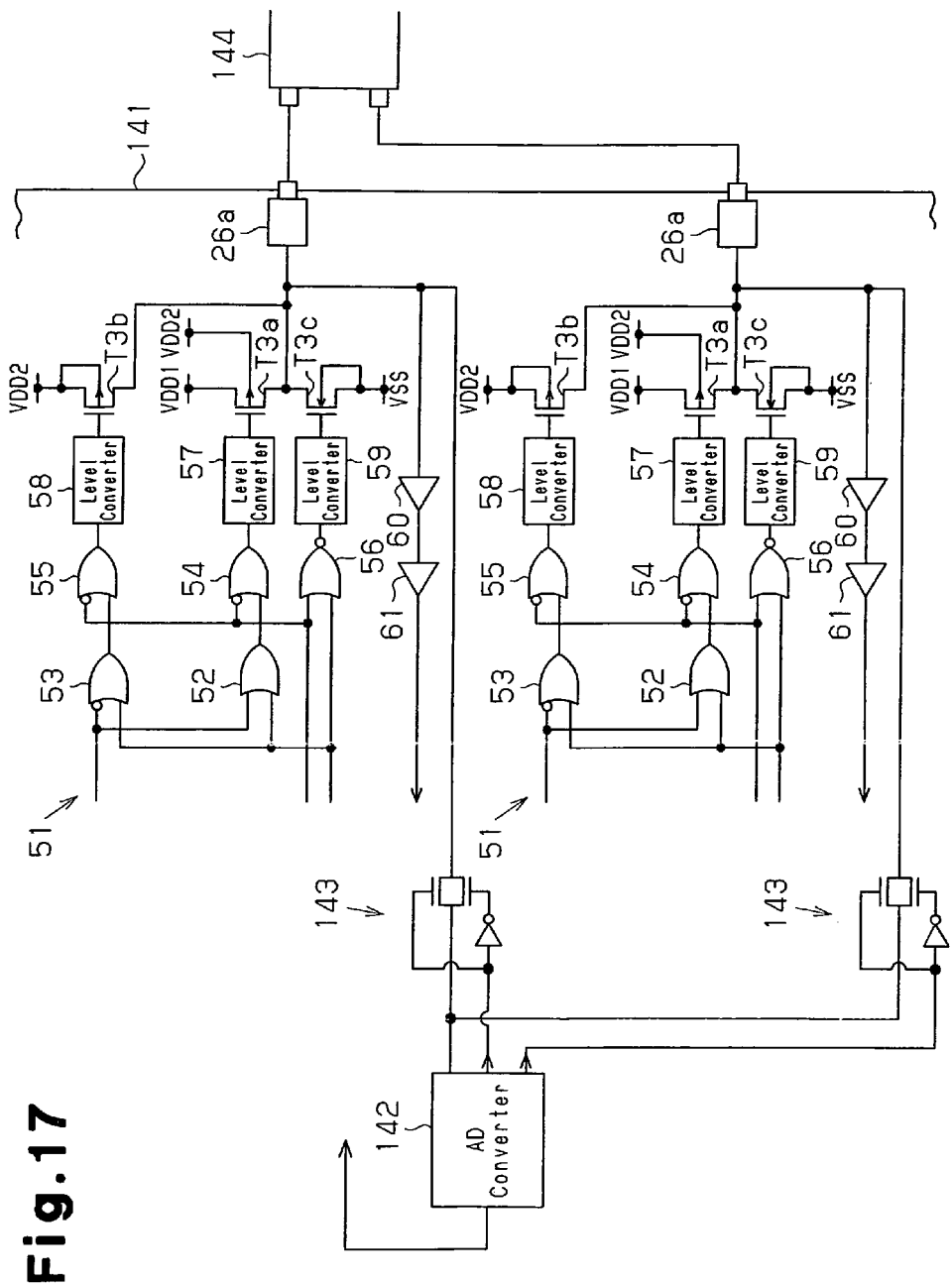
FIG. 17 is a circuit diagram of an I/O circuit according to a sixth modification.

For example, a semiconductor device 141 shown in FIG. 17 includes an analogue-to-digital (AD) converter 142. The AD converter 142 is of one-bit output type, and has an input terminal connected to a pad 26*a* for each I/O circuit 51. A switch circuit (analogue switch) 143 is connected between the AD converter 142 and each pad 26*a*. Each pad 26*a* is connected to an external semiconductor device 144. The semiconductor device 144 provides each pad 26*a* with an H level signal. The AD converter 142 performs A/D conversion of an input signal, by appropriately turning on and off the switch circuit 143 at the time of determining the level of the signal. The AD converter 142 generates a voltage selection signal VSEL according to the conversion result. To be specific, the AD converter 142 generates an L level voltage selection signal VSEL when provided with a signal having the level of the first high-potential power supply VDD1 from the external semiconductor device 144, and generates an H level voltage selection signal VSEL when provided with a signal having the level of the second high-potential power supply VDD2.

The switch circuit 143 may be controlled by an internal circuit (e.g., a CPU). The internal circuit, such as a CPU, may determine the level of a signal provided from the external semiconductor device 144 based on a multiple-bit digital signal output from the AD converter, and provide the corresponding I/O circuit 51 with a voltage selection signal VSEL based on the determination result. Also, one bit included in the multiple-bit digital signal output from the AD converter may be used to represent the voltage selection signal VSEL.

Figure 18:
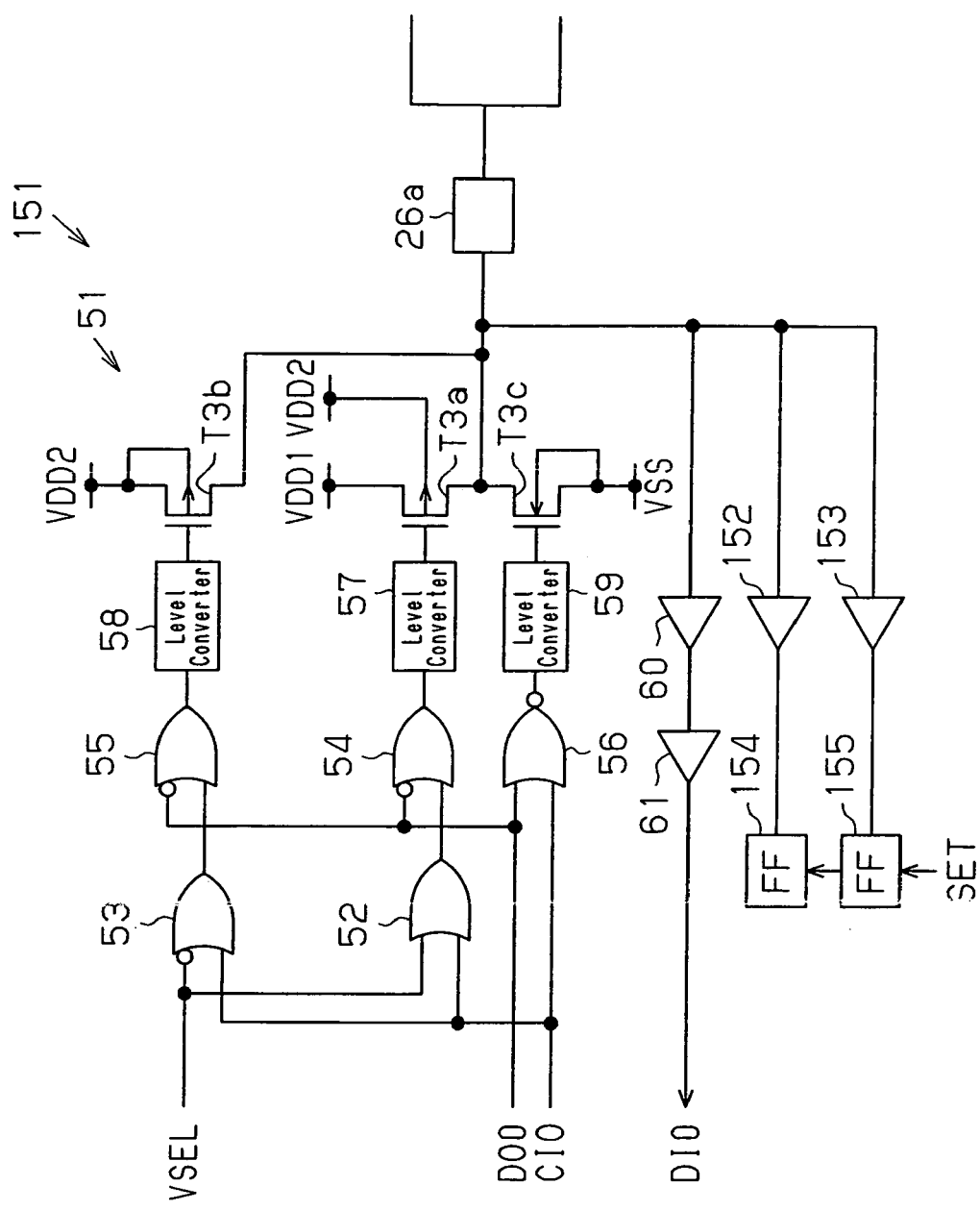
FIG. 18 is a circuit diagram of an I/O circuit according to a seventh modification.

A semiconductor device 151 shown in FIG. 18 includes two input buffers 152 and 153 connected to a pad 26*a*. The input buffers 152 and 153 function as comparison means. A comparator may be used as the comparison means.

Each of the input buffers 152 and 153 has a different threshold voltage. The threshold voltages of the input buffers 152 and 153 are set according to the level of a signal passing through the pad 26*a*, that is, the operating power supply voltage at which the I/O circuit 51 operates (the first high-potential power supply VDD1 and the second high-potential power supply VDD2), or the level of a signal provided from an external semiconductor device connected to the pad 26*a*.

In detail, the level of a signal passing through the pad 26*a* is either the level of the first high-potential power supply VDD1 or the level of the second high-potential power supply VDD2. To determine such a signal level, an input buffer having a threshold voltage set between the two levels is required. The above determination basically requires one input buffer. With only one input buffer, however, whether the determination result is correct remains unknown. For example, when a signal having the level lower than the threshold voltage is provided, the level of the signal may be erroneously determined as the level of the first high-potential power supply VDD1. It is preferable that another input buffer having a threshold voltage lower than the level of the first high-potential power supply VDD1 be used.

To be specific, a first threshold voltage Vth1 of the first input buffer 152 is set at a voltage lower than the voltage of the first high-potential power supply VDD1 (e.g., at 1.5 V), and a second threshold voltage Vth2 of the second input buffer 153 is set at a voltage between the voltages of the first high-potential power supply VDD1 and the second high-potential power supply VDD2 (e.g., at 2 V).

The output terminal of the first input buffer 152 is connected to a first flip-flop (FF) 154. The output terminal of the second input buffer 153 is connected to a second flip-flop (FF) 155. Each of the first and second flip-flops 154 and 155 latches an input signal in response to a fetch signal SET, and outputs the latched signal. An internal circuit, which is not shown (e.g., a CPU), determines the level of a signal provided to the pad 26a based on the latched output signals of the first and second flip-flops 154 and 155, and provides the I/O circuit 51 with a voltage selection signal VSEL based on the determination result.

Figures 19, 20:
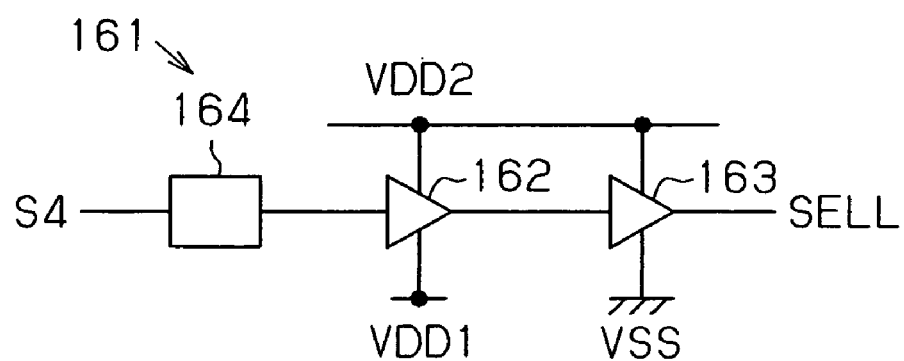
FIG. 19 is a diagram showing determination results in the I/O circuit of FIG. 18.
FIG. 20 is a schematic circuit diagram of a selection signal generation circuit according to an eighth modification.

The output signals of the first and second flip-flops 154 and 155 (output signals of the first and second input buffers 152 and 153) are in combinations shown in FIG. 19. In FIG. 19, "A" represents the output signal of the first flip-flop 154, "B" the output signal of the second flip-flop 155, "1" an H level, and "0" an L level.

When the output signals (A, B) are both at an L level (0, 0), the input levels of the first and second input buffers 152 and 153 are lower than the first threshold voltage Vth1. In other words, the level at the pad 26a is determined to be lower than the level of the first high-potential power supply VDD1. In this case, there is a wait time for determination.

When the output signals (A, B) are at an H level and at an L level (1, 0) respectively, the input level of the first input buffer 152 is higher than the first threshold voltage Vth1, and the input level of the second input buffer 153 is lower than the second threshold voltage Vth2. In other words, the level at the pad 26a is determined as the level of the first high-potential power supply VDD1. In this case, for example, an L level voltage selection signal VSEL is generated, to enable the I/O circuit 51 to operate at the first high-potential power supply VDD1.

When the output signals (A, B) are both at an H level (1, 1), the input level of the first input buffer 152 is higher than the first and second threshold voltages Vth1 and Vth2. In other words, the level at the pad 26a is determined as the level of the second high-potential power supply VDD2. In this case, for example, an H level voltage selection signal VSEL is generated, to enable the I/O circuit 51 to operate at the second high-potential power supply VDD2.

A semiconductor device 161 shown in FIG. 20 includes first and second input buffers 162 and 163. An input terminal of the first input buffer 162 is connected to a pad 164. An output terminal of the first input buffer 162 is connected to an input terminal of the second input buffer 163. The first input buffer 162 has a high-potential power supply terminal connected to the second high-potential power supply VDD2, and a low-potential power supply terminal connected to the first high-potential power supply VDD1. The second input buffer 163 has a high-potential power supply terminal connected to the second high-potential power supply VDD2, and a low-potential power supply terminal connected to the low-potential power supply VSS. The first and second input buffers 162 and 163 connected in this way function as level converters for shifting a low potential level of a signal provided to the pad 164. To be specific, when the level of a signal S4 is the level of the second high-potential power supply VDD2, the first input buffer 162 outputs an H level (level of the second high-potential power supply VDD2) signal, and the second input buffer 163 outputs an H level (level of the second high-potential power supply VDD2) voltage selection signal VSEL. When the level of the signal S4 is the level of the first high-potential power supply VDD1, the first input buffer 162 outputs an L level (level of the first high-potential power supply VDD1) signal, and the second input buffer 163 outputs an L level (level of the low-potential power supply VSS) voltage selection signal VSEL. With such input buffers 162 and 163 being included in the semiconductor device, the operating voltage of the I/O circuit is easily set according to the level of a signal provided to the pad 164.

Figure 21:
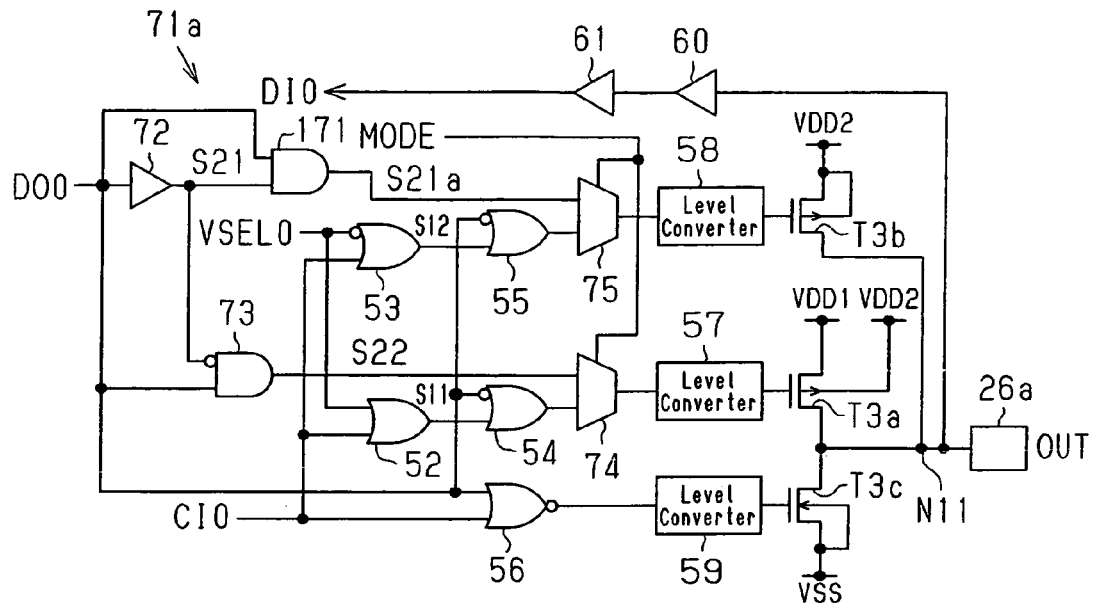
FIG. 21 is a circuit diagram of an I/O circuit according to a ninth modification.
Figure 22:
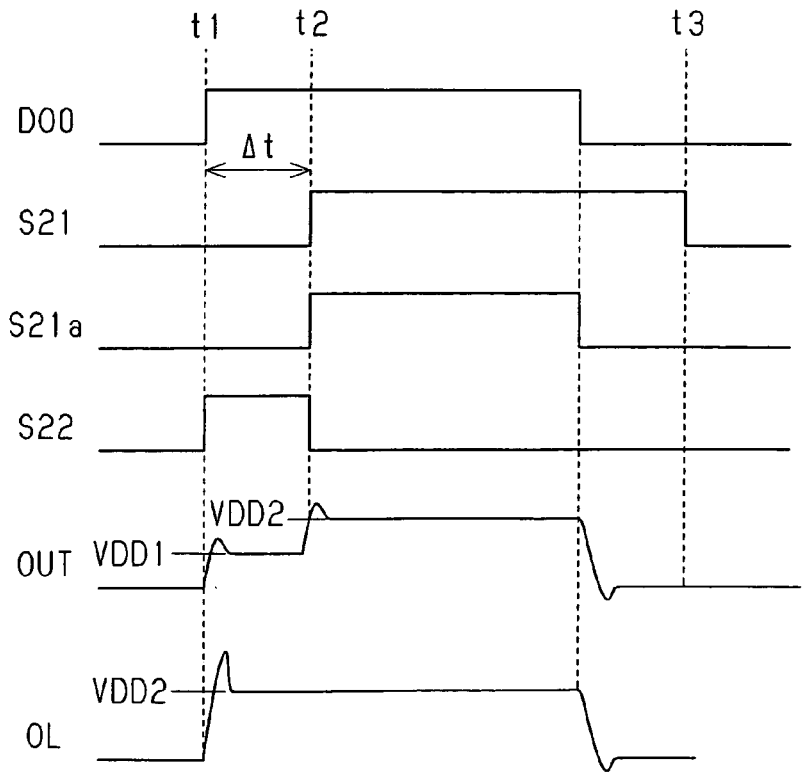
FIG. 22 is an operation waveform diagram of the I/O circuit of FIG. 21.

In the third embodiment (FIG. 8), an I/O circuit 71a shown in FIG. 21 may be used. The I/O circuit 71a includes an AND circuit 171, which is connected between a delay circuit 72 and a second selector circuit 75. The AND circuit 171 provides the second selector circuit 75 with a signal S21a indicating an operational result of the logical AND of an output signal of the delay circuit 72 and an output signal DO0. With this structure, the signal S21a falls at the same timing as the output signal DO0 as shown in FIG. 22. The operation time of the I/O circuit 71a is substantially the same as the operation time of an I/O circuit that is not designed to reduce overshoot. This structure enables the I/O circuit 71a to operate at the same timing as an I/O circuit that is not designed to reduce overshoot.

Figure 23:
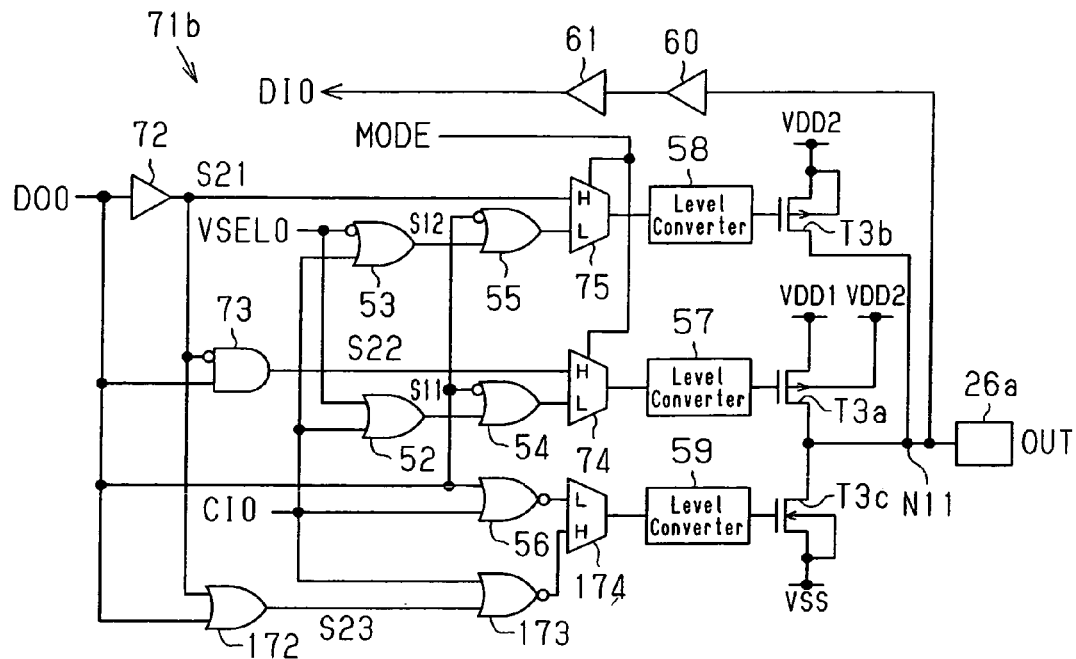
FIG. 23 is a circuit diagram of an I/O circuit according to a tenth modification.

In the third embodiment (FIG. 8), an I/O circuit 71b shown in FIG. 23 may be used. The I/O circuit 71b includes, in addition to the circuit elements shown in FIG. 8, a logic circuit (OR circuit) 172, a logic circuit (NOR circuit) 173, and a selector circuit 174. The OR circuit 172 receives an output signal DO0 and a signal S21. The NOR circuit 173 receives an output signal S23 of the OR circuit 172 and a control signal CIO. The selector circuit 174 is connected between the fifth logic circuit 56 and the level conversion circuit 59. The selector circuit 174 is provided with a mode signal MODE as a control signal, an output signal of the fifth logic circuit 56, and an output signal of the NOR circuit 173. The selector circuit 174 selects the output signal of the NOR circuit 173 or the output signal of the fifth logic circuit 56 based on the mode signal MODE, and generates a signal having substantially the same level as the level of the selected signal. For example, the first selector circuit 74 selects the output signal of the NOR circuit 173 in response to an H level mode signal MODE, and selects the output signal of the fifth logic circuit 56 in response to an L level mode signal MODE.

When the control signal CIO is at an L level, that is, when the I/O circuit 71b generates an output signal OUT based on the output signal DO0, the fifth logic circuit 56 outputs an inversion signal of the output signal DO0, and the NOR circuit 173 outputs an inversion signal of the signal S23. The selector circuit 174 selects one of these signals, so that the output transistor T3c is turned on or off based on the selected signal.

Figure 24:
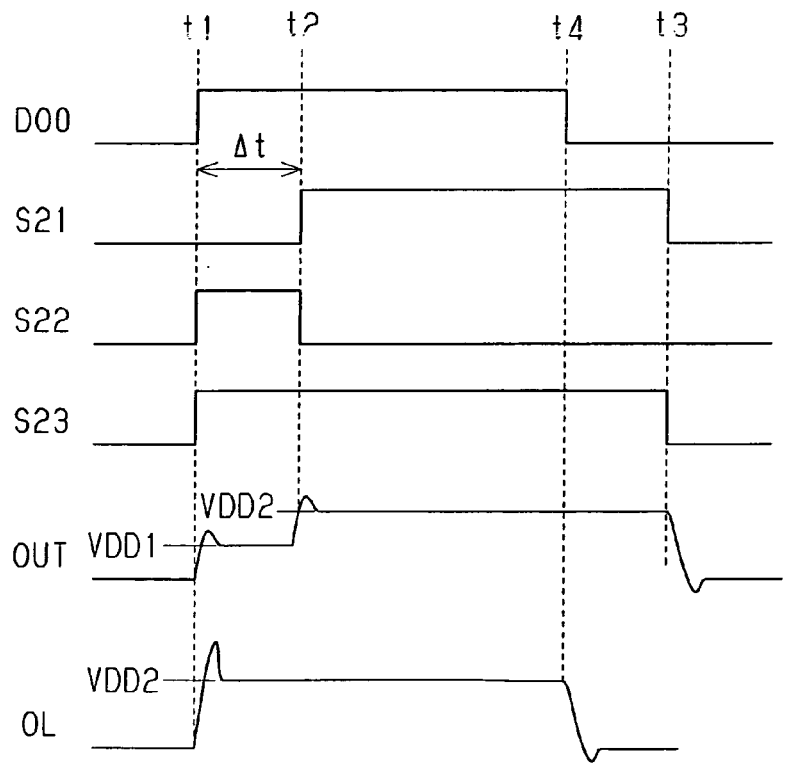
FIG. 24 is an operation waveform diagram of the I/O circuit of FIG. 23.

FIG. 24 is a waveform diagram of the I/O circuit 71b when the mode signal MODE is at an H level. From time t1 to time t2, the first output transistor T3a is on in response to a signal S22. From time t2 to time t3, the second output transistor T3b is on in response to a signal S21. From time t1 to time t3, the third output transistor T3c is off in response to a logical AND operation signal S23, which indicates an operational result of the logical AND of an output signal DO0 and a signal S21. In this way, one of the first to third output transistors T3a to T3c is on.

In the I/O circuit 71 of the third embodiment shown in FIG. 8, the third output transistor T3c is turned on or off in response to an output signal of the fifth logic circuit 56. The output signal of the fifth logic circuit 56 has the inverted level of the output signal DO0. Thus, in the I/O circuit 71 of the third embodiment, the third output transistor T3c is off from time t1 to time t4 at which the output signal DO0 shifts to an L level, and is on from time t4 to time t3. Thus, from time t4 to time t3, both the second output transistor T3b and the third output transistor T3c are on, so that a flow-through current flows via the output transistors T3b and T3c.

Contrary to this, the third output transistor T3c is off from time t1 to time t3. In the I/O circuit 71b shown in FIG. 23, no flow-through current flows. Thus, power consumption of the I/O circuit 71b is smaller than that of the I/O circuit 71 of the third embodiment. In the I/O circuit 71a shown in FIG. 21, the second output transistor T3b is off from the fall of the output signal DO0 to time t3 in response to the signal S21a. Like in the I/O circuit 71b, no flow-through current flows in the I/O circuit 71a. Thus, power consumption of the I/O circuit 71a is smaller than that of the I/O circuit 71 of the third embodiment.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor device, comprising:
    an internal circuit for generating an output signal; and
    an output circuit, connected to the internal circuit, for converting a voltage level of the output signal of the internal circuit, the output circuit including:
        a plurality of first output transistors connected to a plurality of high-potential power supplies having different voltages, respectively;
        a second output transistor connected to a low-potential power supply and to the plurality of first output transistors; and
        a control circuit for selecting, in a first mode, one of the plurality of first output transistors according to a voltage selection signal and causing the selected first output transistor and the second output transistor to perform a level conversion operation, and for sequentially controlling, in a second mode, the plurality of first output transistors according to the voltage of each of the plurality of high-potential power supplies.

2. The semiconductor device according to claim 1, wherein the plurality of first output transistors include:
    a first transistor connected to a first high-potential power supply; and
    a second transistor connected to a second high-potential power supply having a voltage higher than a voltage of the first high-potential power supply;
    wherein the second output transistor is connected between the low-potential power supply, the first transistor, and the second transistor; and
    the control circuit first activates the first transistor, and then activates the second transistor.

3. The semiconductor device according to claim 1, further comprising:
    a signal generation circuit, connected to the output circuit, for generating the voltage selection signal, wherein the signal generation circuit includes a fuse that is broken when a voltage selection signal for selecting a specific one of the plurality of output cells is generated.

4. The semiconductor device according to claim 1, further comprising:
    a rewritable storage unit for storing setting of voltage; and
    a signal generation circuit, connected to the storage unit, for generating the voltage selection signal based on the stored setting information.

5. The semiconductor device according to claim 1, further comprising a plurality of input buffers, each having a different threshold voltage and generating a buffer output signal according to the threshold voltage, wherein an operating voltage of a device connected to the semiconductor device is detected based on the buffer output signal of each input buffer, and the voltage selection signal is generated based on the detected operating voltage.

6. The semiconductor device according to claim 1, further comprising:
    a first input buffer having a first low-potential power supply terminal, connected to a first high-potential power supply, and a first high-potential power supply terminal, connected to a second high-potential power supply having a voltage higher than a voltage of the first high-potential power supply, wherein the first input buffer receives an external signal and generates a buffer output signal; and
    a second input buffer having a second low-potential power supply terminal, connected to a low-potential power supply, and a second high-potential power supply terminal, connected to the second high-potential power supply, wherein the second input buffer receives the buffer output signal from the first input buffer and generates the voltage selection signal.

* * * * *